United States Patent
Inatsuka

(10) Patent No.: US 10,134,672 B2
(45) Date of Patent: Nov. 20, 2018

(54) SEMICONDUCTOR MEMORY DEVICE HAVING A STEPPED STRUCTURE AND CONTACT WIRINGS FORMED THEREON

(71) Applicant: TOSHIBA MEMORY CORPORATION, Tokyo (JP)

(72) Inventor: Takuya Inatsuka, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/409,331

(22) Filed: Jan. 18, 2017

(65) Prior Publication Data
US 2017/0271256 A1 Sep. 21, 2017

Related U.S. Application Data

(60) Provisional application No. 62/308,693, filed on Mar. 15, 2016.

(51) Int. Cl.
| H01L 23/528 | (2006.01) |
| H01L 27/11551 | (2017.01) |
| H01L 27/11578 | (2017.01) |
| H01L 23/522 | (2006.01) |
| H01L 23/532 | (2006.01) |
| H01L 21/768 | (2006.01) |
| H01L 21/311 | (2006.01) |

(52) U.S. Cl.
CPC ...... *H01L 23/528* (2013.01); *H01L 21/31144* (2013.01); *H01L 21/76805* (2013.01); *H01L 21/76877* (2013.01); *H01L 23/5226* (2013.01); *H01L 23/53209* (2013.01); *H01L 23/53271* (2013.01); *H01L 27/11551* (2013.01); *H01L 27/11578* (2013.01)

(58) Field of Classification Search
CPC ...................................................... H01L 23/528
See application file for complete search history.

(56) References Cited

U.S. PATENT DOCUMENTS

| 7,847,334 | B2 * | 12/2010 | Katsumata | ............ | H01L 21/764 257/314 |
| 8,592,890 | B2 * | 11/2013 | Watanabe | ......... | H01L 27/11578 257/314 |
| 9,184,177 | B2 * | 11/2015 | Imamura | ........... | H01L 27/11582 |

(Continued)

*Primary Examiner* — Eugene Lee
(74) *Attorney, Agent, or Firm* — Patterson & Sheridan, LLP

(57) ABSTRACT

A semiconductor storage device includes a substrate, a stack of first insulating layers and conductive layers that are alternately formed on the substrate in a memory region and a peripheral region and electrically insulated from each other, a second insulating layer covering the stack of the first insulating layers and the conductive layers in the peripheral region, and a plurality of contact wirings formed in the peripheral region, each contact wiring extending from an upper surface of the second insulating layer towards the substrate and electrically connected to a corresponding one of the conductive layers. In the peripheral region, each conductive layer has an extended portion that covers side and upper surfaces of an end portion of a first insulating layer that is formed immediately thereabove, and each contact wiring is in direct contact with the extended portion of the corresponding conductive layer.

8 Claims, 20 Drawing Sheets

(56) References Cited

U.S. PATENT DOCUMENTS

| | | | |
|---|---|---|---|
| 9,853,048 B2* | 12/2017 | Kim | H01L 27/11582 |
| 2008/0073635 A1* | 3/2008 | Kiyotoshi | H01L 27/105 |
| | | | 257/2 |
| 2010/0207240 A1* | 8/2010 | Hashimoto | H01L 27/11578 |
| | | | 257/532 |
| 2011/0156132 A1* | 6/2011 | Kiyotoshi | H01L 27/11575 |
| | | | 257/326 |
| 2012/0077320 A1* | 3/2012 | Shim | H01L 27/11582 |
| | | | 438/269 |
| 2012/0119287 A1 | 5/2012 | Park et al. | |
| 2012/0322252 A1 | 12/2012 | Son et al. | |
| 2014/0264925 A1* | 9/2014 | Chen | H01L 21/76816 |
| | | | 257/774 |
| 2014/0377934 A1 | 12/2014 | Takesako | |
| 2016/0071861 A1* | 3/2016 | Serov | H01L 27/11556 |
| | | | 365/185.19 |
| 2016/0133568 A1* | 5/2016 | Wu | H01L 23/535 |
| | | | 257/314 |
| 2016/0204102 A1* | 7/2016 | Chen | H01L 27/0688 |
| | | | 257/774 |
| 2016/0268269 A1* | 9/2016 | Ichinose | H01L 27/1157 |

* cited by examiner

SEMICONDUCTOR MEMORY DEVICE HAVING A STEPPED STRUCTURE AND CONTACT WIRINGS FORMED THEREON

CROSS-REFERENCE TO RELATED APPLICATIONS

This application is based upon and claims the benefit of priority from U.S. Provisional Patent Application No. 62/308,693, filed on Mar. 15, 2016, the entire contents of which are incorporated herein by reference.

FIELD

Embodiments described herein relate generally to a semiconductor memory device and a method of manufacturing a semiconductor memory device.

BACKGROUND

A NAND-type flash memory including a staircase structure is known.

DETAILED DESCRIPTION

Figure 1:
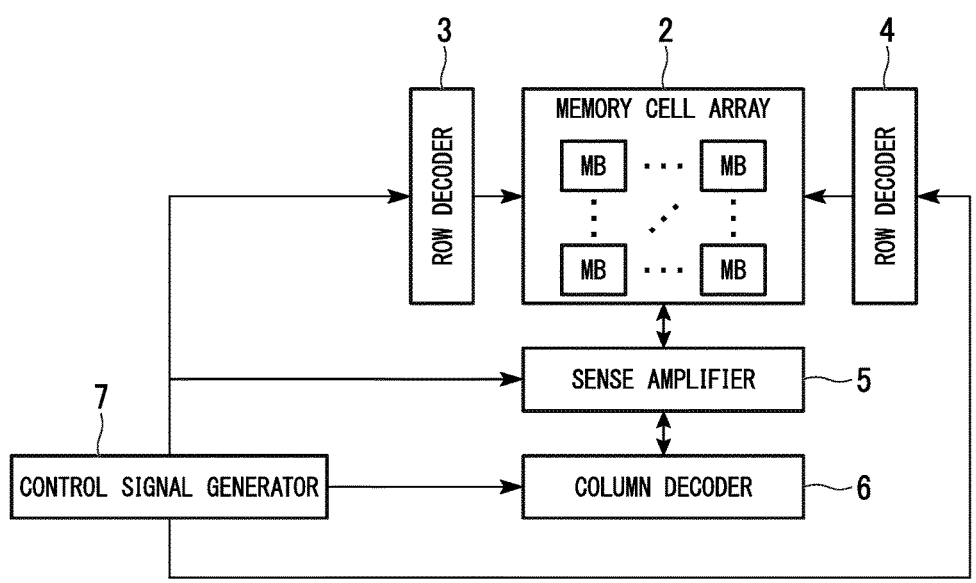
FIG. 1 is a block diagram of a semiconductor memory device according to a first embodiment.

A semiconductor storage device includes a substrate, a stack of first insulating layers and conductive layers that are alternately formed on the substrate in a memory region and a peripheral region of the semiconductor storage device, the conductive layers being electrically insulated from each other, a second insulating layer covering the stack of the first insulating layers and the conductive layers in the peripheral region, and a plurality of contact wirings formed in the peripheral region, each contact wiring extending from an upper surface of the second insulating layer towards the substrate and electrically connected to a corresponding one of the conductive layers. In the peripheral region, each conductive layer has an extended portion that covers side and upper surfaces of an end portion of a first insulating layer that is formed immediately thereabove, and each contact wiring is in direct contact with the extended portion of the corresponding conductive layer.

A semiconductor memory device and a method of manufacturing a semiconductor memory device according to embodiments will be described below, with reference to the drawings. In the drawings, common elements are assigned same reference symbols.

First Embodiment

FIG. 1 shows functional blocks of a semiconductor memory device 1 according to a first embodiment.

The semiconductor memory device 1 according to the first embodiment includes a memory cell array 2, row decoders 3 and 4, a sense amplifier 5, a column decoder 6, and a control signal generator 7.

The memory cell array 2 includes a plurality of memory blocks MB. Each memory block MB includes a plurality of memory transistors (not shown) that forms a plurality of three-dimensionally-arranged memory cells. Each memory block MB is a unit of data erasing. The memory blocks MB are divided by a plurality of grooves extending in one direction.

The row decoders 3 and 4 decode block address signals and the like transmitted from the control signal generator 7. The row decoders 3 and 4 control data write operations and data read operations with respect to the memory cell array 2.

The sense amplifier 5 senses and amplifies electrical signals which flow in the memory cell array 2 at the time of a read operation. The column decoder 6 decodes column address signals transmitted from the control signal generator 7 and controls the sense amplifier 5 to selectively retrieve data.

The control signal generator 7 generates control signals such as the block address signals and the column address signals or the like and controls the row decoders 3 and 4, the sense amplifier 5, and the column decoder 6.

Figure 2:
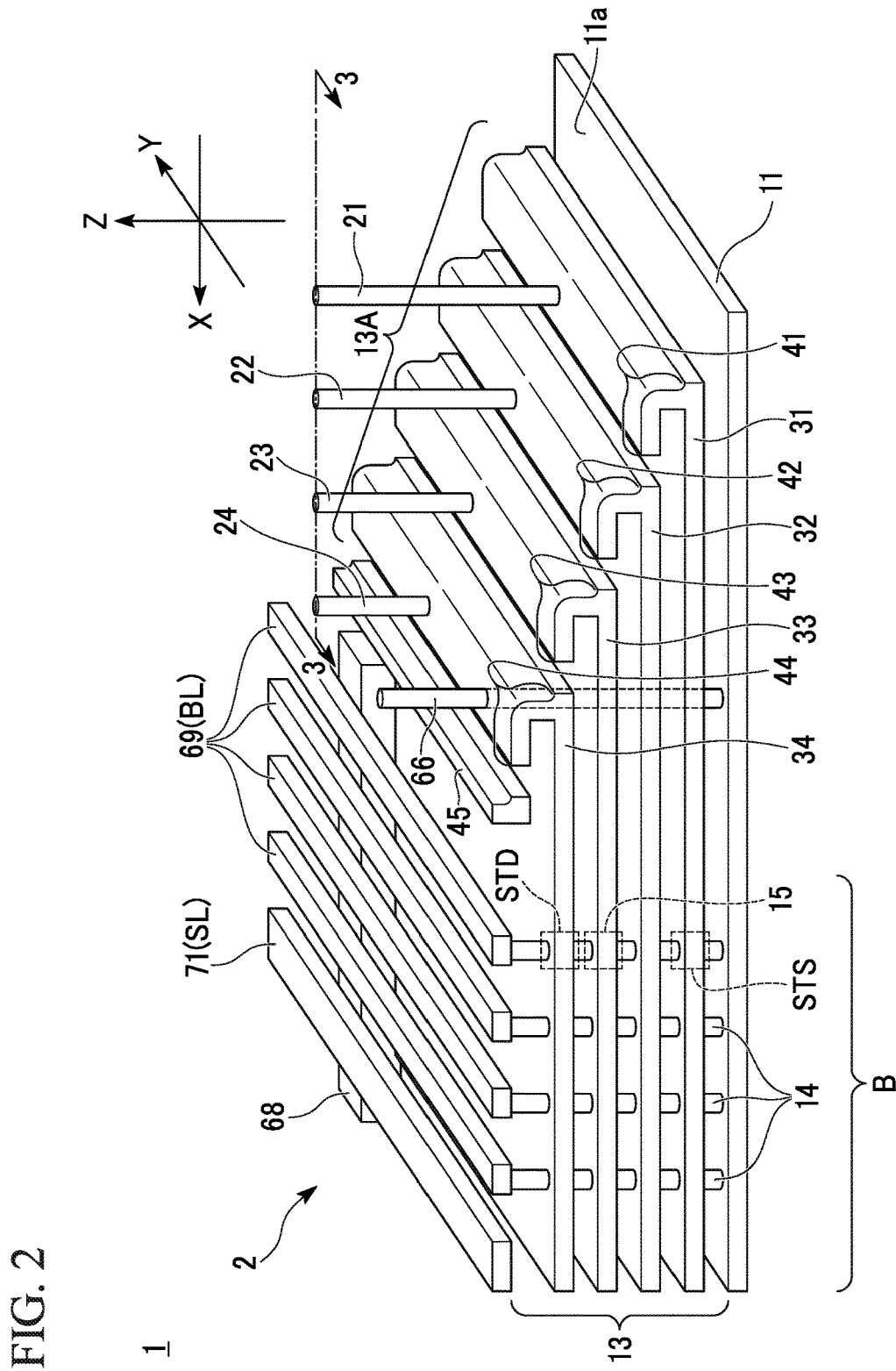
FIG. 2 is a perspective view of a memory cell array included in the semiconductor memory device according to the first embodiment.

FIG. 2 is a perspective view of the memory cell array 2 of the semiconductor memory device 1 according to the first embodiment. In FIG. 2, section B shows a memory region, X direction is a direction of arrangement of conductive lines 69, Y direction is substantially perpendicular to X direction and a direction in which the conductive lines 69 and 71 extend, and Z direction is a thickness direction of the semiconductor substrate 11. For example, Z direction (i.e., a thickness direction of the semiconductor substrate 11) is a vertical direction with respect to a surface (e.g., main surface 11a) of the semiconductor substrate 11. FIG. 2 shows one example of the memory cell array 2, and the numbers and positions of the elements are not limited to the numbers and positions shown in FIG. 2.

Figure 3:
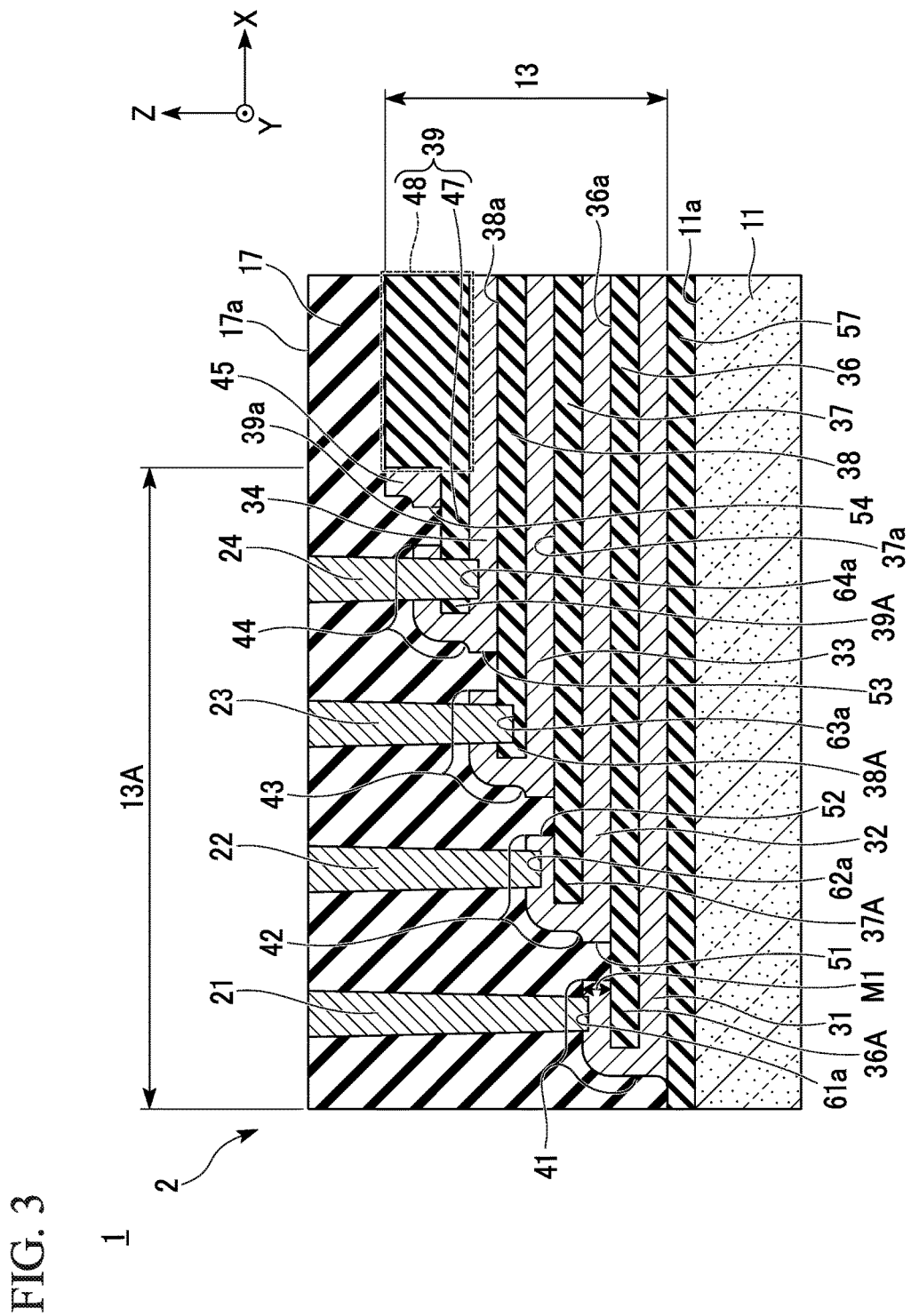
FIG. 3 is a cross-sectional view of the memory cell array taken along a line 3-3 shown in FIG. 2.

FIG. 3 is a cross-sectional view of the memory cell array 2 taken along a line 3-3 shown in FIG. 2. In FIG. 3, elements that are the same as ones shown in FIG. 1 and FIG. 2 are assigned the same reference symbols. The positions of bases (i.e., bottom edges, lower ends) 61a to 64a of contact holes 61 to 64 shown in FIG. 3 are exemplary and are not limited to these positions at least in the depth direction, as long as they do not pass through the conductive layer disposed immediately below.

In FIG. 2, from the standpoint of making the drawing easy to be understood, a second insulating film 17, first insulating layers 36 to 39, an insulating layer 57, and the plurality of contact holes 61 to 64 of FIG. 3 are not shown.

Referring to FIG. 2 and FIG. 3, the memory cell array 2 of the semiconductor memory device 1 according to the first embodiment includes a semiconductor substrate 11, the insulating layer 57, a staircase structure 13, the second insulating layer 17, memory pillars 14, memory cells 15, a beam pillar 66, contacts 21 to 24 (a plurality of contacts), a conductive part 68, and conductive lines 69 and 71. The staircase structure 13 may be called a "staircase structure body". Each of the contacts 21 to 24 may be called a "contact interconnect".

The semiconductor substrate 11 has a main surface 11a. The semiconductor substrate 11 is, for example, a p-type monocrystalline silicon substrate.

The insulating layer 57 covers the main surface 11a of the semiconductor substrate 11. A conductive layer 31 is formed over the insulating layer 57. The conductive layer 31 is located above the insulating layer 57. The insulating layer 57 includes, for example, a silicon oxide.

The staircase structure 13 is a multi-layered structure. The staircase structure 13 is may be called a "stair structure" or "stair-step structure". The staircase structure 13 includes conductive layers 31 to 34, a plurality of first insulating layers 36 to 39, a plurality of conductors 41 to 44, and a remaining conductive part 45. The conductive layers 31 to 34 and the first insulating layers 36 to 39 are alternately laminated on the main surface 11a of the semiconductor substrate 11.

The staircase structure 13 has, on its end part, the staircase section 13A that has a stepped structure. The staircase section 13A may be called a "stair section" or "stair-step section". The stepped structure is one, for example, in which the end part of the n-th step in X direction, counting from the semiconductor substrate 11 side, extends further in the −X direction than the end part of the (n+1)th step, such that a relationship that the end part of the (n+1)th step extends further in the −X direction than the end part of the (n+2)th step, is maintained.

The conductive layers 31 to 34 are stacked so that end parts of a conductive layer is receded in X direction with respect to the end parts of its lower conductive layer. The term "recede" refers to a state in which edges of two adjacent conductive layers are not aligned, and the edge of the upper one is inside the edge of the lower one in a direction substantially parallel to the surface of the substrate. For facilitating the understanding of the term "recede", an example of the term "recede" is illustrated in FIG. 1, wherein the lower one has a side extension region which is positioned outside the edge of the upper one. In the present embodiment, lengths of the plurality of conductive layers 32 to 34 in X direction are different from one another. For example, among the plurality of the conductive layers 31 to 34, the closer a conductive layer is to the semiconductor substrate 11, the longer the conductive layer extends in X direction. In another view point, among the plurality of the conductive layers 31 to 34, a lower conductive layer has extension part which extends in X direction with respect to an immediate upper conductive layer. The end parts of the conductive layers 31 to 34 are the end parts of the staircase structure 13. The conductive layers 31 to 34 may have the same thickness. Each of the end parts of the conductive layers 31 to 34 may be called an "edge" or "edge part".

Each of the end part of the conductive layers 32 to 34 refers to a certain region in the vicinity of the end surface of each of the conductive layers 32 to 34.

The lowermost conductive layer 31 is a source-side selection gate electrode layer (SGS) of a source-side selection transistor STS. The uppermost conductive layer 34 is a drain-side selection gate electrode layer (SGD) of a drain-side selection transistor STD. The conductive layers 32 and 33 are the gate electrode layers of the memory cells 15. The number of conductive layers 32 and 33 is arbitrary.

The first insulating layers 36 to 38 and the conductive layers 31 to 33 are laminated alternately.

The first insulating layer 39 is formed above (e.g., formed over) the conductive layer 34. The first insulating layer 39 includes a first part 47 and a second part 48. The first part 47 is provided closer to the end part of the conductive layer 34 than the second part 48. The first part 47 may have the same thickness as the first insulating layers 36 to 38.

The second part 48 is thicker than the first part 47. That is, the first insulating layer 39 has a step that is formed by the first part 47 and the second part 48.

The first insulating layers 36 to 39 are, for example, silicon oxide films (e.g., SiO$_2$ films).

The conductors 41 to 44 are connected to the end parts of the conductive layers 31 to 34.

The conductor 41 is formed on the end part of the conductive layer 31 and connected to (e.g., joined to) the conductor layer 31. The first insulating layer 36 is located immediately above the conductive layer 31. The conductor 41 covers the end part 36A of the first insulating layer 36 and extends partially over the upper surface 36a of the first insulating layer 36. That is, a part of the conductor 41 is provided on the upper surface 36a of the first insulating layer 36 and located immediately above the first insulating layer 36. The end part 36A of the first insulating layer 36 refers to a certain region from the end surface of the first insulating layer 36.

The conductive layer 32 is formed on the upper surface 36a of the first insulating layer 36 and located immediately above the first insulating layer 36. The conductor 41 is spaced apart from the conductive layer 32. The conductor 41 is spaced apart from the conductive layer 32 by a groove 51 that is formed between the conductor 41 and the conductive layer 32 and extends in Y direction. The conductor 41 is electrically isolated from the conductive layer 32.

The conductor 41 has thickness M1 that is the same as the thickness of the conductors 42 to 44.

Each of the conductors 42 to 44 has a structure substantially the same as the conductor 41. That is, the difference between the conductors 42 to 44 and the conductor 41 is that, whereas the conductor 41 is connected to the conductive layer 31, the conductor 42 is connected to the conductive layer 32, the conductor 43 is connected to the conductive layer 33, and the conductor 44 is connected to the conductive layer 34.

The conductor 42 and the conductive layer 33 are separated by the groove 52, and the conductor 43 and the conductive layer 34 are separated by the groove 53.

The conductor 44 is separated from the remaining conductive part 45 formed on the upper surface 39a of the first insulating layer 39. That is, the conductor 44 is separated from the remaining conductive part 45 by the groove 54 that extends in Y direction.

The remaining conductive part 45 is a conductive film that remains at the step formed in the first insulating layer 39. The conductive film serves as a base layer when the conductors 41 to 44 are formed. There are cases in which the remaining conductive part 45 is removed and does not remain.

The conductive layers 31 to 34, the conductors 41 to 44, and the remaining conductive part 45 are made, for example, of the same conductive material, which is, for example, tungsten (W).

The plurality of memory pillars 14 are formed in a memory region B (region in which the staircase section 13A is not formed) of the main surface 11a of the semiconductor substrate 11. The memory pillars 14 pass through the staircase structure 13 in Z direction. The memory pillars 14 are laid out arbitrarily in the XY plane.

The memory cells 15 are formed at intersections of the memory pillars 14 and the conductive layers 32 and 33.

The second insulating layer 17 is formed over the semiconductor substrate 11 and covers the staircase structure 13. The upper surface 17a of the second insulating layer 17 is substantially flat. The second insulating layer 17 includes, for example, a silicon oxide.

The source-side selection transistor STS is formed at an intersection of each memory pillar 14 and the conductive layer 31. The drain-side selection transistor STD is formed at an intersection of each memory pillar 14 and the conductive layer 34.

The drain-side selection transistor STD, the plurality of memory cells 15, and the source-side selection transistor STS are connected in series.

The beam pillar 66 passes through the staircase structure 13 and the insulating layer 57 in Z direction. The beam pillar 66 reaches the main surface 11a of the semiconductor substrate 11.

The contacts 21 and 22 are first contacts (e.g., first contact interconnects). The contact 23 is a second contact (e.g., second contact interconnect). The contact 24 is a third contact (e.g., third contact interconnect). Each of the contacts 21, 22, 23, 24 may be called a "contact via" or "contact plug".

The lower ends of the contacts 21 to 24 are positioned in this order from the semiconductor substrate 11. That is, the lower end of the contact 21 is closer to the semiconductor substrate 11 than the lower end of the contact 22 is. The lower end of the contact 22 is closer to the semiconductor substrate 11 than the lower end of the contact 23 is. The lower end of the contact 23 is closer to the semiconductor substrate 11 than the lower end of the contact 24 is. Stated differently, using the upper surfaces of the contacts 21 to 24 as a reference, parts of the lower ends of the contacts 21 to 24 are provided at decreasing depths in the sequence of the contact 21 to the contact 24. The contacts 21 to 24 are joined to the conductors 41 to 44, respectively.

This joining is not limited to a case in which bottom surfaces of the contacts 21 to 24 contact the conductors 41 to 44, but also a case in which a part of one or more lower ends of the contacts 21 to 24 is buried in the conductors 41 to 44 and corresponding one or more bottom surfaces and a part of one or more side surfaces of the contacts 21 to 24 contact the conductors 41 to 44, and a case in which one or more lower ends of the contacts 21 to 24 pass through the conductors 41 to 44 and a part of corresponding one or more side surfaces of the contacts 21 to 24 contact the conductors 41 to 44.

The position of the bottom end of the contact 22 is shallower than the position of the bottom end of the contact 21. The position of the bottom end of the contact 23 is shallower than the position of the bottom end of the contact 22. The position of the bottom end of the contact 24 is shallower than the position of the bottom end of the contact 23.

In this manner, the relationship may be such that, with the main surface 11a of the semiconductor substrate 11 as a reference, the closer the bottom end of the contacts 21 to 24 is to the semiconductor substrate 11 (the deeper it is), the smaller is the degree of disposition of the contacts 21 to 24 inside the conductors 41 to 44.

The connection structure between the contacts 21 to 24 and the conductors 41 to 44 will be described in detail below.

The bottom end of the contact 21 is disposed inside the conductor 41. The bottom end of the contact 22 is disposed inside the conductor 42 to a position that is deeper than the contact 21. That is, the position of the bottom end of the contact 22 with respect to the top surface of the conductor 42 is deeper than the position of the bottom end of the contact 21 with respect to the top surface of the conductor 41.

The thickness of the conductor 42 remaining between the contact 22 and the first insulating layer 37 is less than the thickness of the conductor 41 remaining between the contact 21 and the first insulating layer 36.

The contact 23 passes through the conductor 43 and reaches the first insulating layer 38. The bottom end of the contact 23 contacts the first insulating layer 38. The contact 23 contacts the conductor 43 at its side surface.

The contact 24 passes through the conductor 44 and through the first insulating layer 39 (e.g., first part 47) formed below the conductor 44. The contact 24 reaches the conductive layer 34 formed below the first insulating layer 39. The contact 24 contacts the conductor 44 and the conductive layer 34 at its side surface.

The conductive part 68 is formed to extend in X direction and Z direction above the main surface 11a of the semiconductor substrate 11. In Y direction, the conductive part 68 is opposite to the side surfaces of the conductive layers 31 to 34.

A plurality of conductive lines 69 extend in Y direction and are arranged in X direction. The plurality of conductive lines 69 is the bit lines BL.

The conductive line 71 is formed at the top end of the conductive part 68. The conductive line 71 extends in Y direction. The conductive line 71 is the source line SL.

The conductive part 68, the plurality of conductive lines 69, and the conductive line 71 include, for example, tungsten (W).

Next, referring to FIG. 4 to FIG. 13, the method of manufacturing the semiconductor memory device 1 according to the first embodiment will be described.

FIG. 4 to FIG. 13 are cross-sectional views of a structure to show the process for manufacturing the semiconductor memory device 1 of the first embodiment, which correspond to cross-sections of the contacts 21 to 24 on a plane that is perpendicular to the main surface 11a of the semiconductor substrate 11 of the semiconductor memory device 1.

Figure 4:
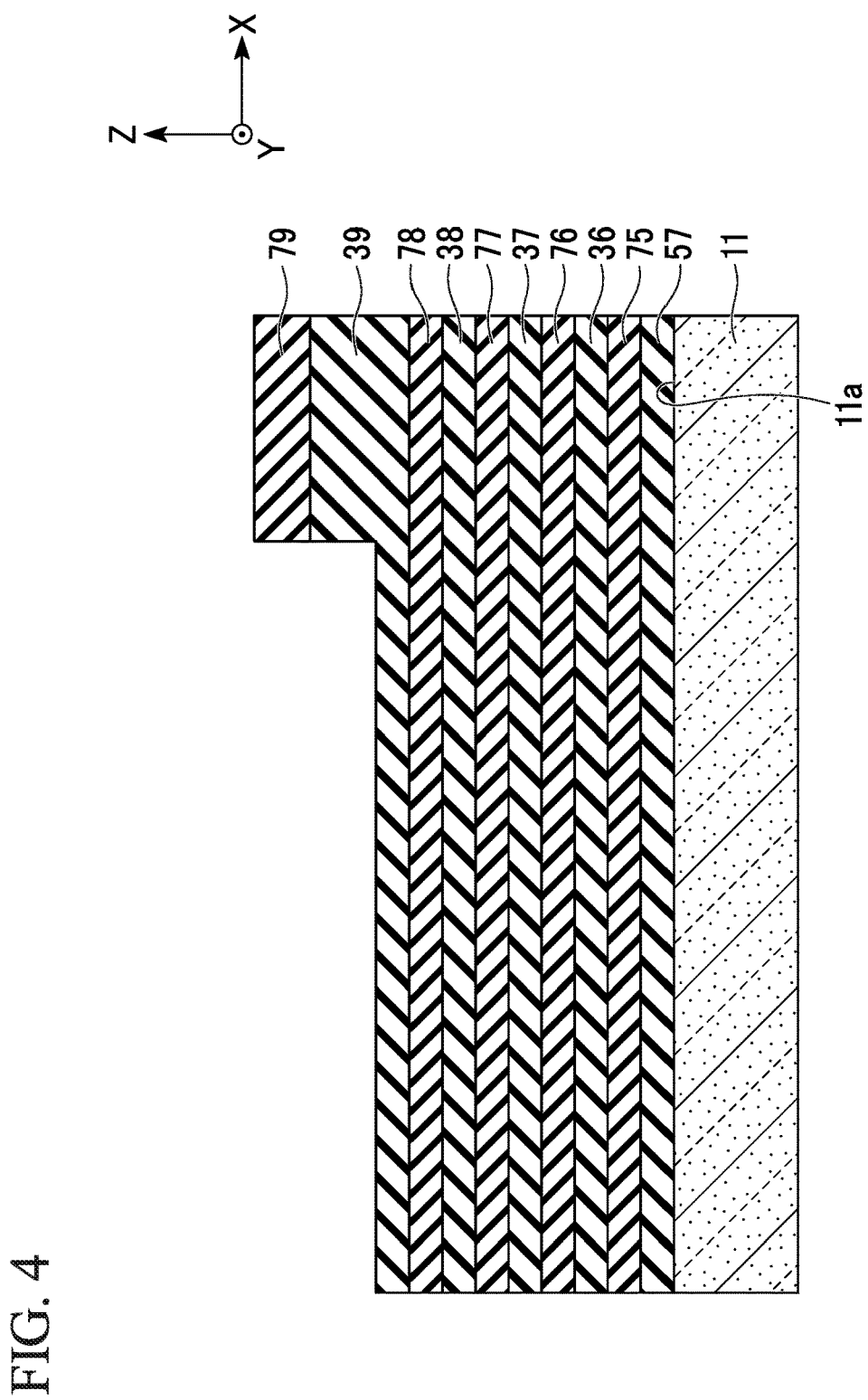
FIGS. 4 through 13 are cross-sectional views of a structure during manufacturing of the semiconductor memory device according to the first embodiment.

In the process step shown in FIG. 4, the insulating layer 57, a first sacrificial insulating layer 75, the first insulating layer 36, a first sacrificial insulating layer 76, the first insulating layer 37, a first sacrificial insulating layer 77, the first insulating layer 38, a first sacrificial insulating layer 78, the first insulating layer 39, and a stopper insulating film 79 are stacked onto the main surface 11a of the semiconductor substrate 11 in that sequence.

The first sacrificial insulating layers 75 to 78 are layers that are to be replaced by conductive layers (SGD, gate electrode layer, SGS) in a later process. The material of the first sacrificial insulating layers 75 to 78 and the stopper insulating film 79 is a material different from the first insulating layers 36 to 39, has a sufficient etching selectivity ratio with respect to the first insulating layers 36 to 39. The first sacrificial insulating layers 75 to 78 and the stopper insulating film 79 are formed, for example, by deposition of a silicon nitride.

The stopper insulating film 79 and the first insulating layer 39 are partially removed to reduce the thickness of a part of the first insulating layer 39.

Figure 5:
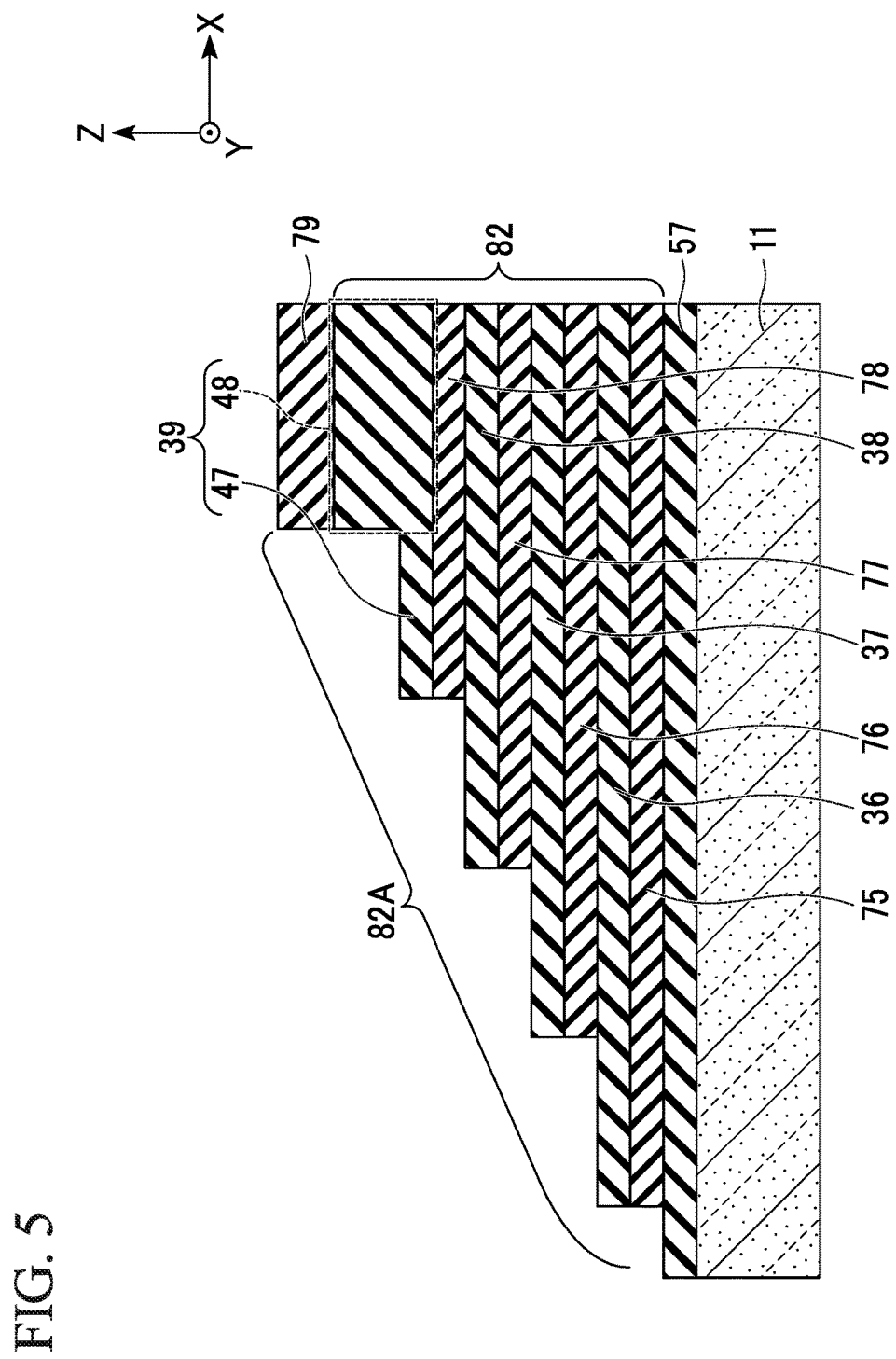

In the process step shown in FIG. 5, the end parts of the upper first sacrificial insulating layers 76 to 78 and first insulating layers 37 to 39 are caused to recede with respect to the end parts of the lower first sacrificial insulating layers 75 to 77 and first insulating layers 36 to 38, thereby forming the staircase structure 82 (e.g., staircase structure body) that includes a staircase section 82A at the end part thereof. By forming the staircase section 82A, the first part 47 and the second part 48 are formed.

Figure 6:
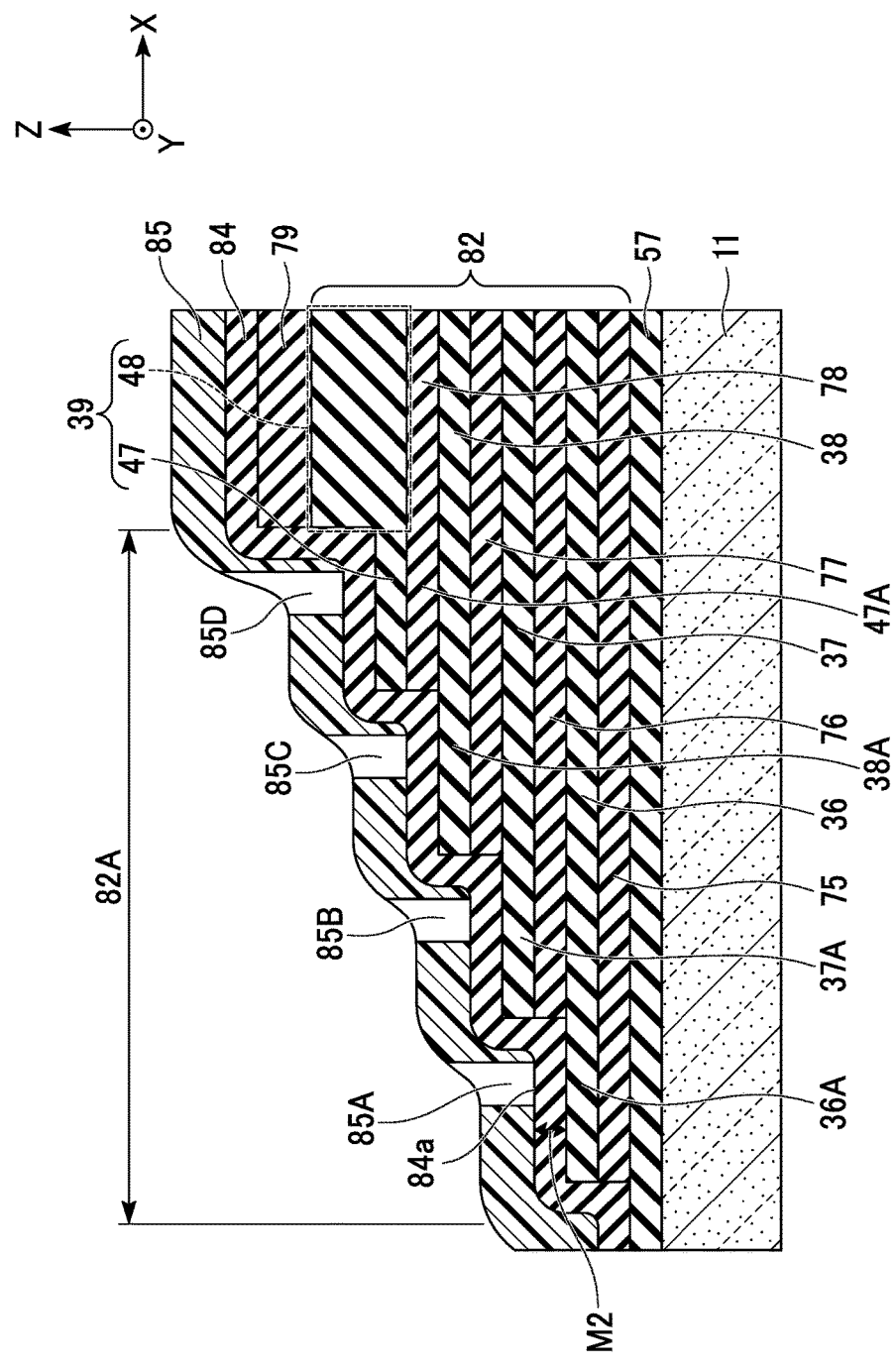

In the process step shown in FIG. 6, by growing an insulating layer of the same type as the first sacrificial insulation layers 75 to 78 on the stopper insulating film 79 and the staircase section 82A, a second sacrificial insulating layer 84 that covers the stopper insulating film 79 and the staircase section 82A are formed.

After patterning, the second sacrificial insulating layer 84 is replaced by the conductors 41 to 44 shown in FIG. 3. The second sacrificial insulating layer 84 is formed by growing an insulating film of the same type as the first sacrificial insulating layers 75 to 78. The second sacrificial insulating layer 84 is formed by depositing, for example, a silicon nitride. The thickness M2 of the second sacrificial insulating layer 84 is in a range of 1 to 1.5 times the thickness M1 of the conductors 41 to 44 shown in FIG. 3.

An etching mask 85 that includes aperture grooves 85A to 85D extending in Y direction is formed in the second sacrificial insulating layer 84. The aperture groove 85A exposes the upper surface 84a of the second sacrificial insulating layer 84 formed above the end part 36A of the first insulating layer 36. The aperture groove 85B exposes the upper surface 84a of the second sacrificial insulating layer 84 formed above the end part 37A of the first insulating layer 37.

The aperture groove 85C exposes the upper surface 84a of the second sacrificial insulating layer 84 formed above the end part 38A of the first insulating layer 38. The aperture groove 85D exposes the upper surface 84a of the second sacrificial insulating layer 84 formed above the first part 47.

Figure 7:
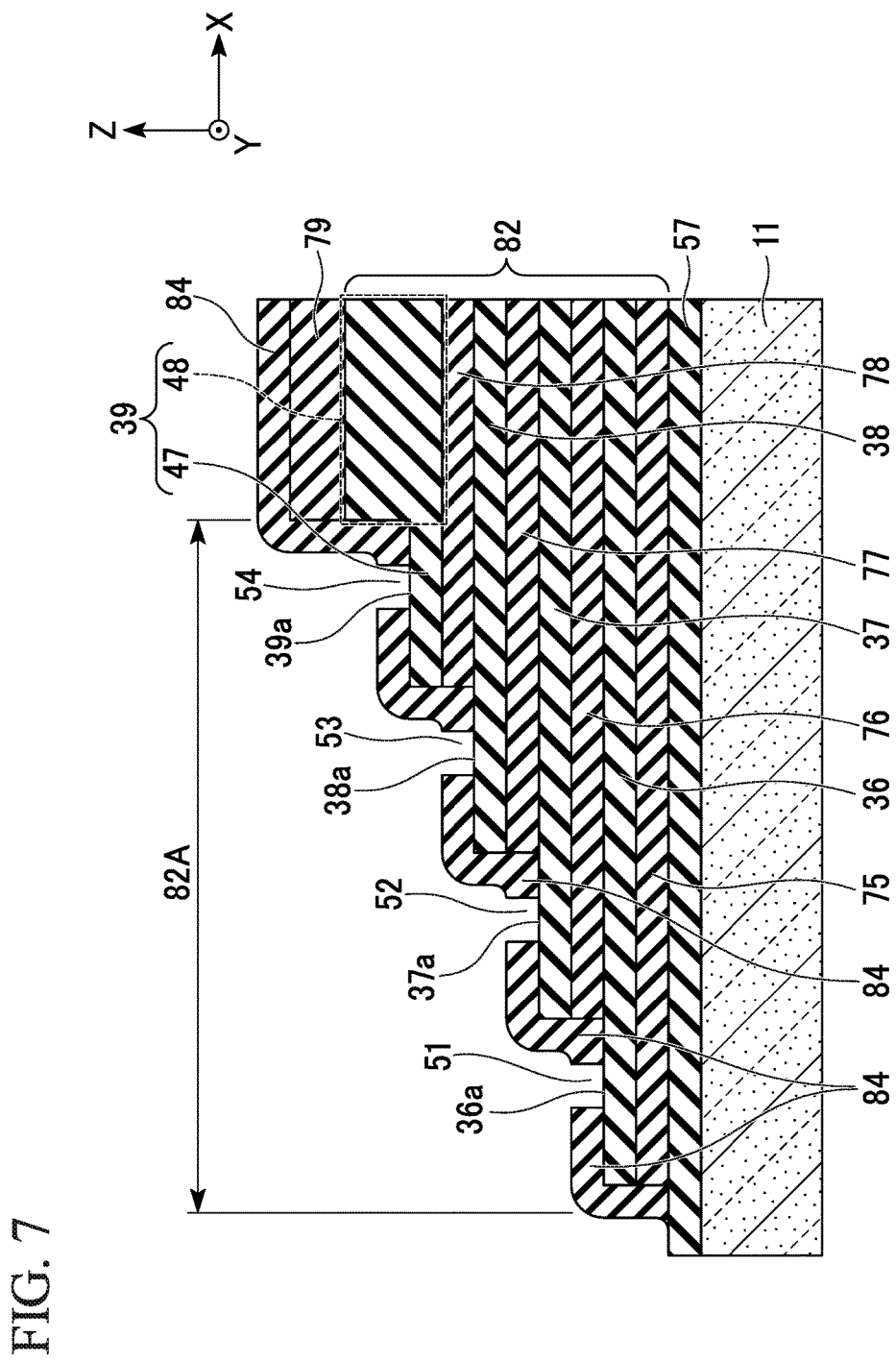

In the process step shown in FIG. 7, grooves 51 to 54, which expose the upper surfaces 36a to 39a of the first insulating layers 36 to 39, are formed in the second sacrificial insulating layer 84 formed above the first insulating layers 36 to 39 of the staircase section, thereby multiply separating the second sacrificial insulating layer 84 in the direction of the extension of the staircase section 82A (second sacrificial insulating layer separation step).

The second sacrificial insulating layer separation step includes, for example, a step of forming the etching mask 85 on the second sacrificial insulating layer 84, a step of anisotropic dry etching through the etching mask 85 to remove unwanted parts and to multiply separate the second sacrificial insulating layer 84, and a step of removing the etching mask after separating the second sacrificial insulating layer 84.

Figure 8:
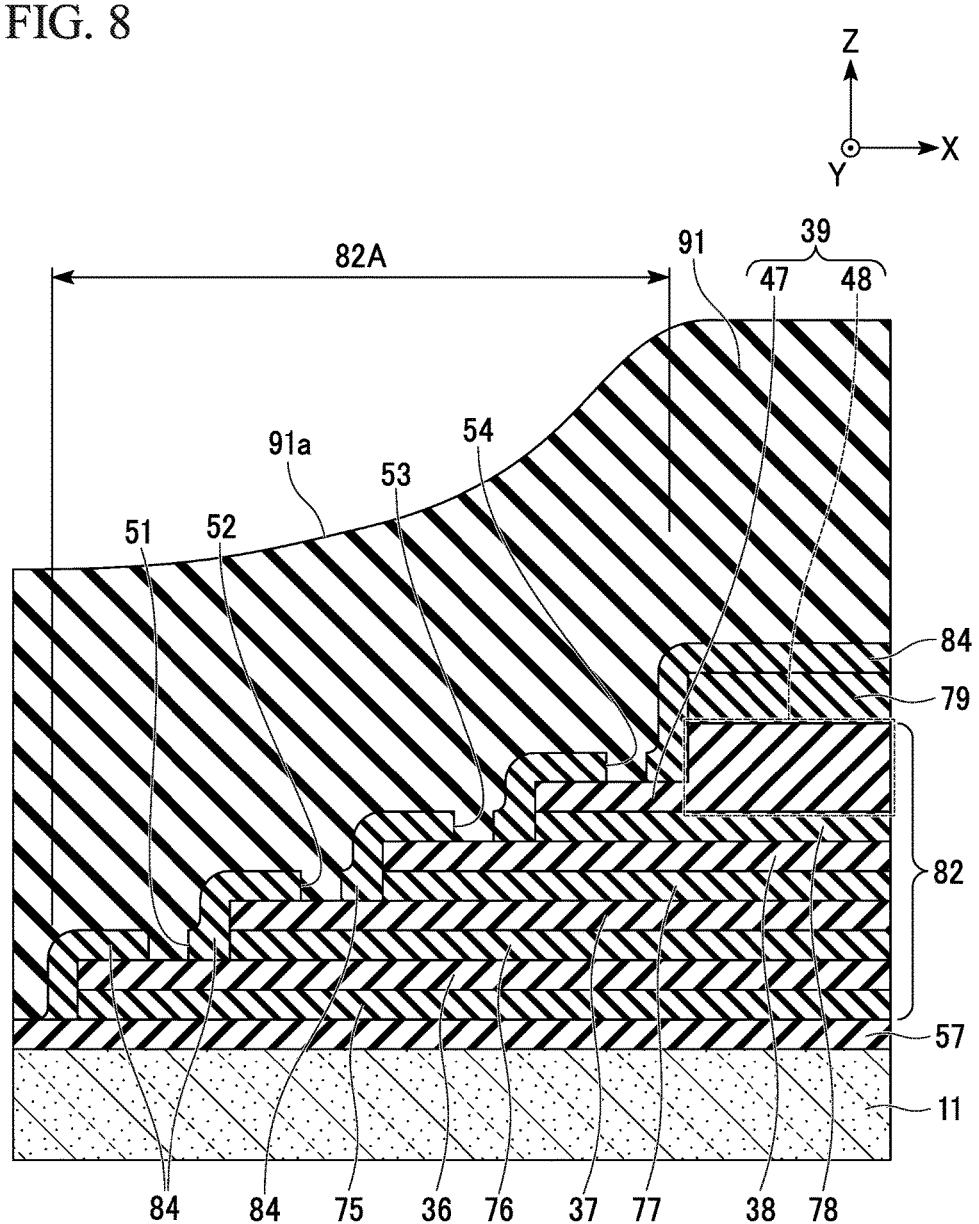

In the process step shown in FIG. 8, a first interlayer insulating film 91 is formed so as to cover the staircase section 82 in which the multiply separated second sacrificial insulating layer 84 is formed. The first interlayer insulating film 91 is formed, for example, by depositing a silicon oxide.

At this time, the first interlayer insulating film 91 fills the grooves 51 to 54. The first interlayer insulating film 91 is formed along the shape of the staircase section 82A. For that reason, the upper surface 91a of the first interlayer insulating film 91 has unevenness.

Figure 9:
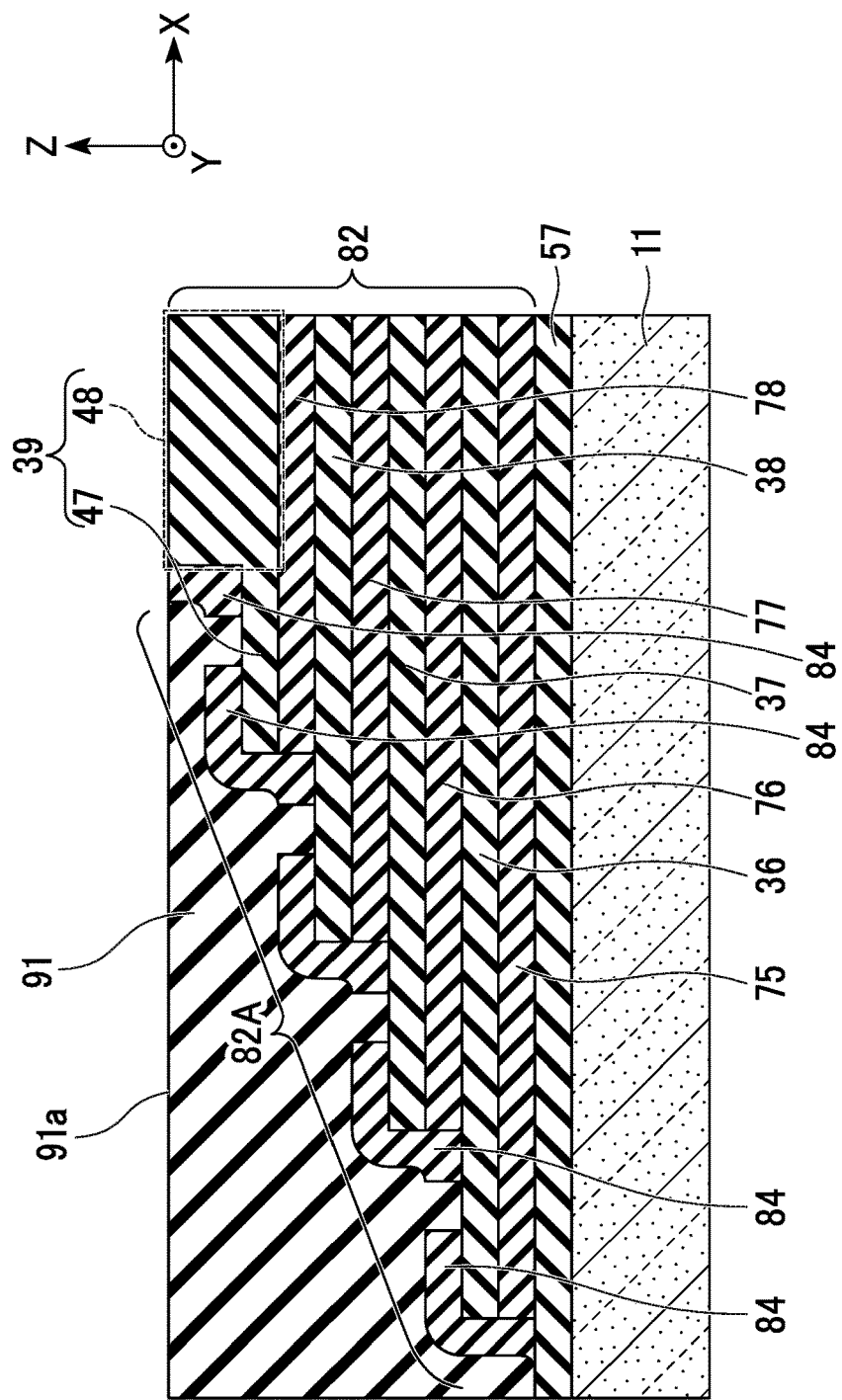

In the process step shown in FIG. 9, the first interlayer insulating film 91 is polished by CMP until the second part 48 is exposed, thereby planarizing the upper surface 91a of the first interlayer insulating film 91. At this time, the stopper insulating film 79 shown in FIG. 8 serves as a polishing stopper.

After the above-described polishing, the second sacrificial insulating layer 84 remains at the step formed at the boundary between the first part 47 and the second part 48.

Figure 10:
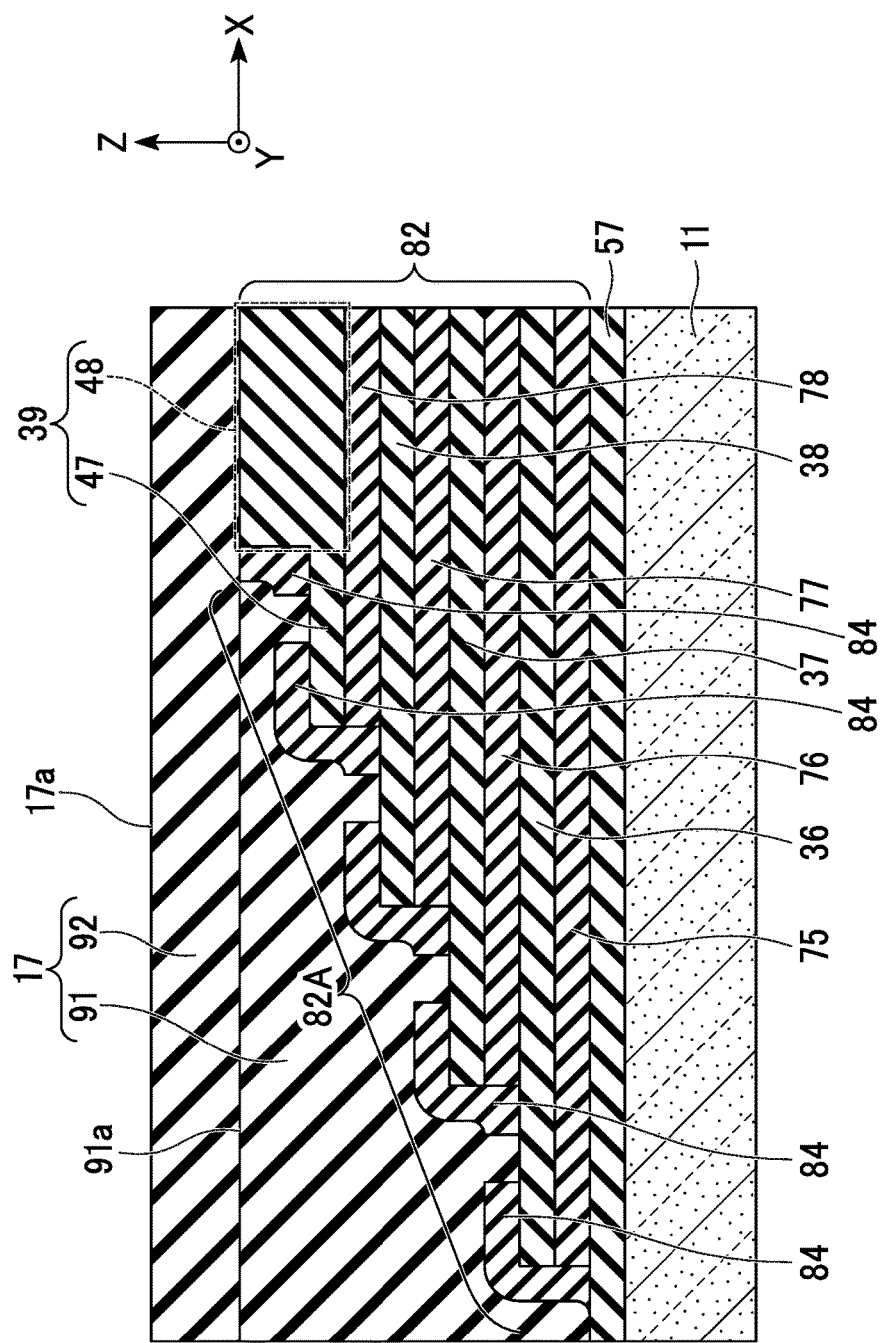

In the process step shown in FIG. 10, a second interlayer insulating film 92 covering the upper surface of the structure shown in FIG. 9 is formed. The second interlayer insulating film 92 is formed, for example, by depositing a silicon oxide. As a result, the second insulating layer 17 that is formed of the first interlayer insulating film 91 and the second interlayer insulating film 92 and includes the planarized upper surface 17a is formed.

The beam pillar 66 shown in FIG. 2 is formed. The beam pillar 66 is formed so as to pass through the staircase structure 82 formed below the first part 47 and the second insulating layer 17 formed above the first part 47.

Figure 11:
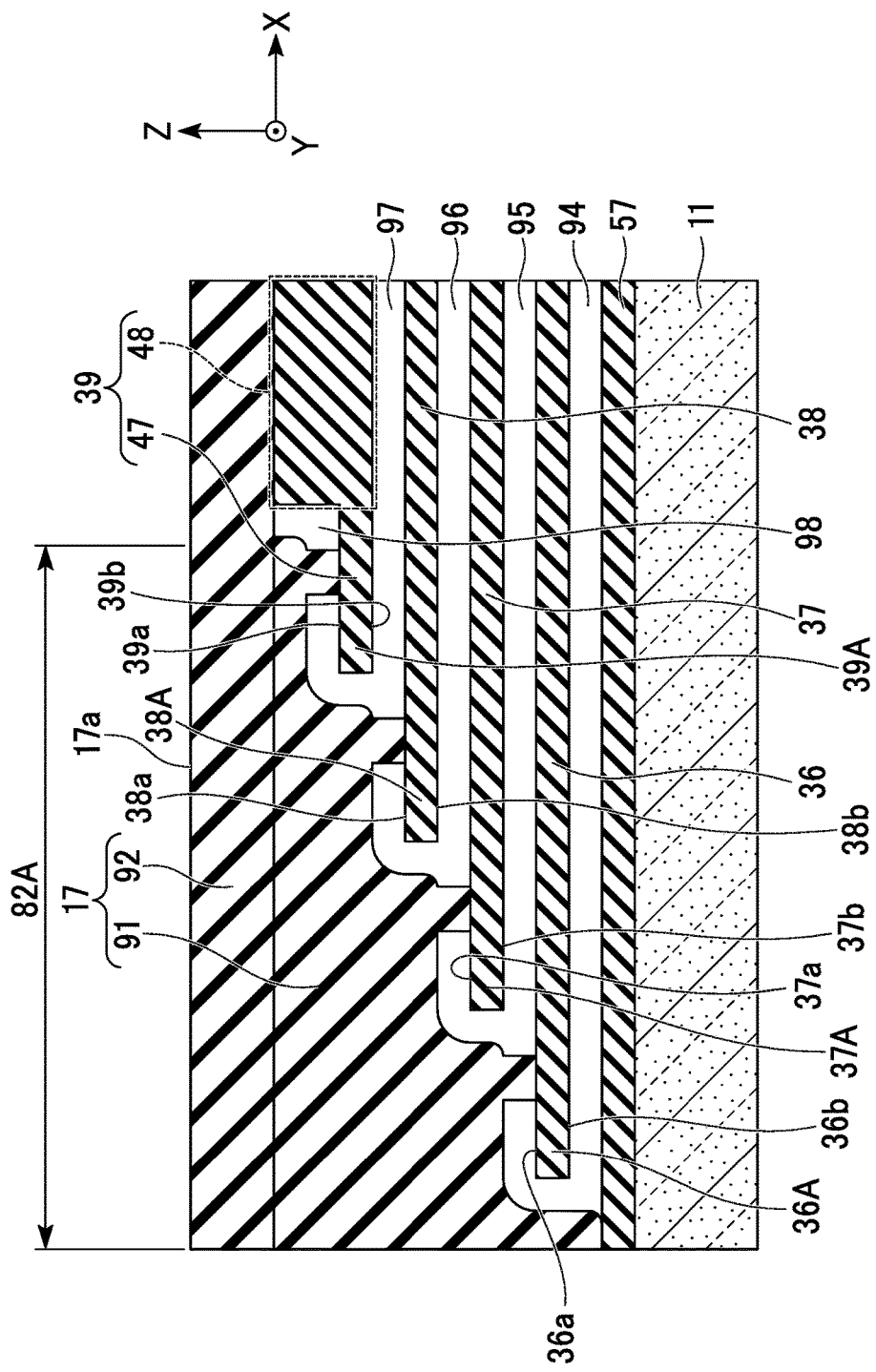

In the process step shown in FIG. 11, a plurality of spaces 94 to 98 is formed by removing the first sacrificial insulating layers 75 to 78 and the second sacrificial insulating layer 84 shown in FIG. 10 using wet etching. The etchant is, for example, hot phosphoric acid.

The space 94 exposes the end part 36A of the first insulating layer 36 and the upper surface of the insulating layer 57 that opposes the first insulating layer 36. The space 95 exposes end part 37A and the lower surface 37b of the first insulating layer 37 and the upper surface 36a of the first insulating layer 36 that opposes the first insulating layer 37.

The space 96 exposes the end part 38A and the lower surface 38b of the first insulating layer 38 and the upper surface 37a of the first insulating layer 37 that opposes the first insulating layer 38. The space 97 exposes the end part 39A and the lower surface 39b of the first insulating layer 39 and the upper surface 38a of the first insulating layer 38 that opposes the first insulating layer 39. The space 98 is formed at the step of the first insulating layer 39.

Figure 12:
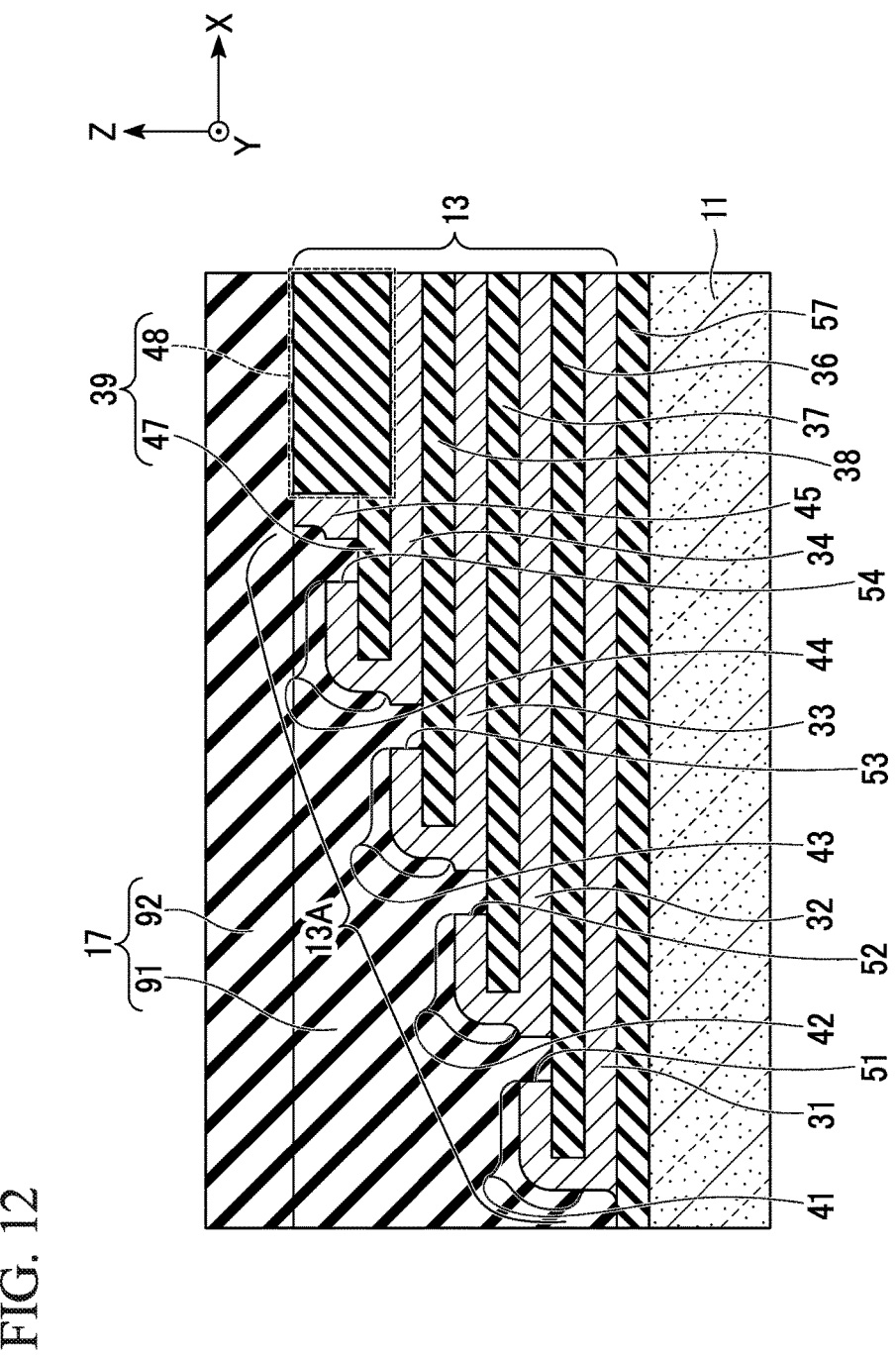

In the process step shown in FIG. 12, by filling in the plurality of spaces 94 to 97 using a conductive material, the plurality of conductors 41 to 44 and the plurality of conductive layers 31 to 34 are formed all at one time. At this time, the remaining conductor 45 that fills the space 98 is also formed. By the grooves 51 to 54, the conductors 41 to 44 are separated from other conductive layers 31 to 34 or the remaining conductive part 45 above the first insulating layers 36 to 39 immediately thereabove. The conductive material includes, for example, tungsten.

Figure 13:
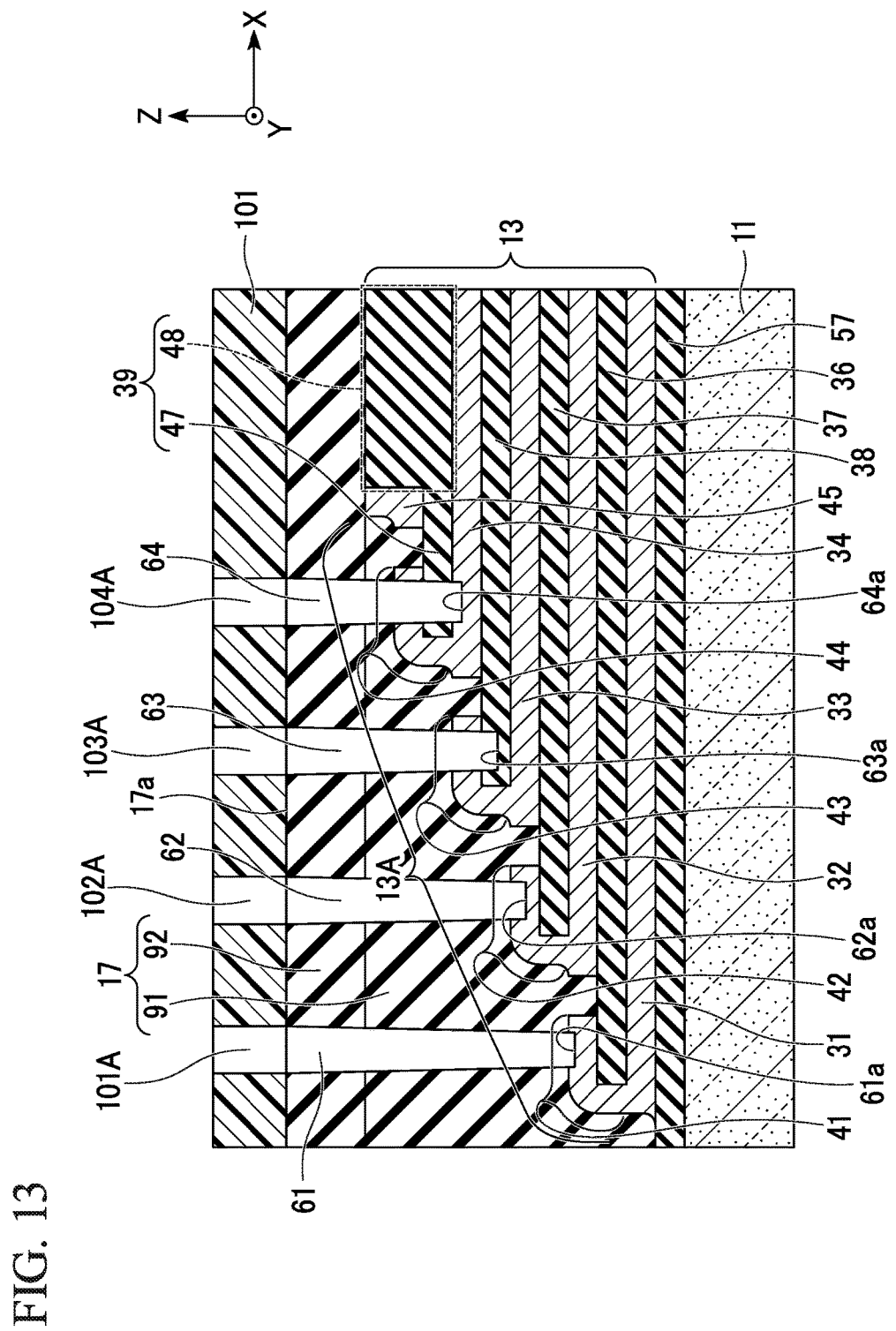

In the process step shown in FIG. 13, an etching mask 101 that includes the apertures 101A to 101D is formed on the second insulating layer 17.

The apertures 101A, 101B, 101C, and 101D are formed above, respectively, the conductors 41, 42, 43, and 44.

By using anisotropic etching through the etching mask 101 of the second insulating layer 17 formed below the apertures 101A to 101D, the contact holes 61 to 64 are formed in the second insulating layer 17. In this anisotropic etching, the base 61a of the contact hole 61 reaches the conductor 41.

The conditions of the anisotropic etching are determines so as to selectively etch the second insulating layer 17 (e.g., conditions under which the conductors 41 to 44 and the conductive layers 31 to 34 are more difficult to etch than the second insulating layer 17). By using such conditions, the conductors 41 to 44 and the conductive layers 31 to 34 serve as etching stoppers.

Thereafter, the etching mask 101 is removed and the upper surface 17a of the second insulating layer 17 is exposed.

As shown in FIG. 3, by filling the contact holes 61 to 64 with a conductive material, the contacts 21 to 24 electrically connected to the conductive layers 31 to 34 on different layers are formed all at one time. The conductive material includes, for example, tungsten.

In the first embodiment, the conductors 41 to 44 that overlap with and are also connected to the conductive layers 31 to 34 in Z direction, are formed at the end parts 36A to 38A of the first insulating layers 36 to 38. For this reason, even if a lower end of the contact 24 protrudes the conductor 44, the protrusion can be stopped at the conductive layer 34, thereby enabling expansion of the process margin.

By making the thickness M1 of the conductors 41 to 44 greater than the thickness of the conductive layers 31 to 34, the process margin can be further expanded.

Second Embodiment

Figure 14:
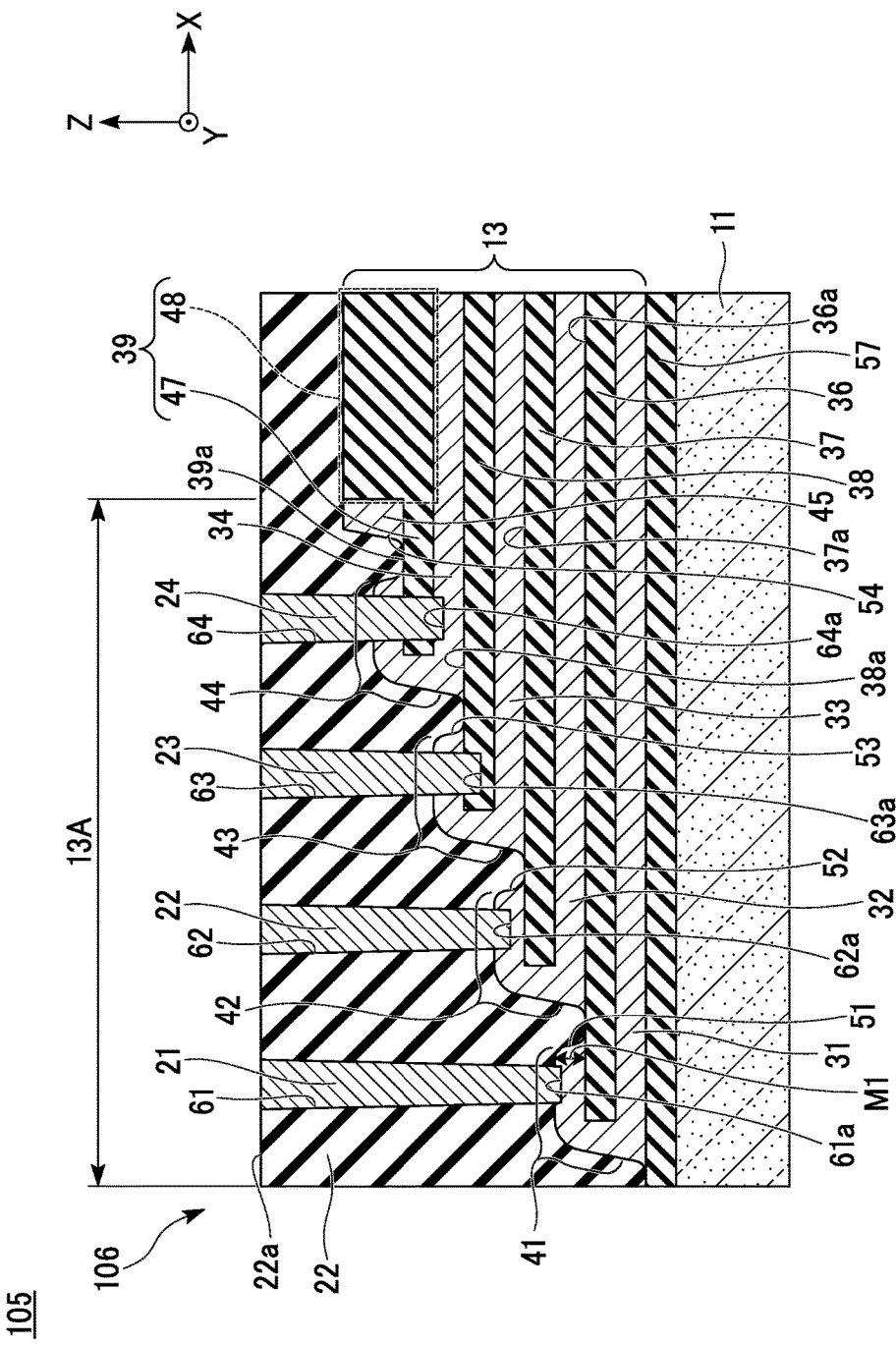
FIG. 14 is a cross-sectional view of a memory cell array of a semiconductor memory device according to a second embodiment.

FIG. 14 is a cross-sectional view of a memory cell array 106 of a semiconductor memory device 105 according to a second embodiment. In FIG. 14, elements that are the same as those of the memory array 2 of the semiconductor memory device 1 shown in FIG. 3 are assigned the same reference symbols.

In a memory cell array 106 of a semiconductor memory device 105 of the second embodiment, the partitioning by the grooves 51 to 55 by two rounded curved surfaces that are oppose to each other in X direction is different from the memory cell array 2 according to the first embodiment.

The method of manufacturing the semiconductor memory device 105 of the second embodiment (mainly the memory cell array 106) will be described, referring mainly to FIG. 14 to FIG. 16.

Figure 15:
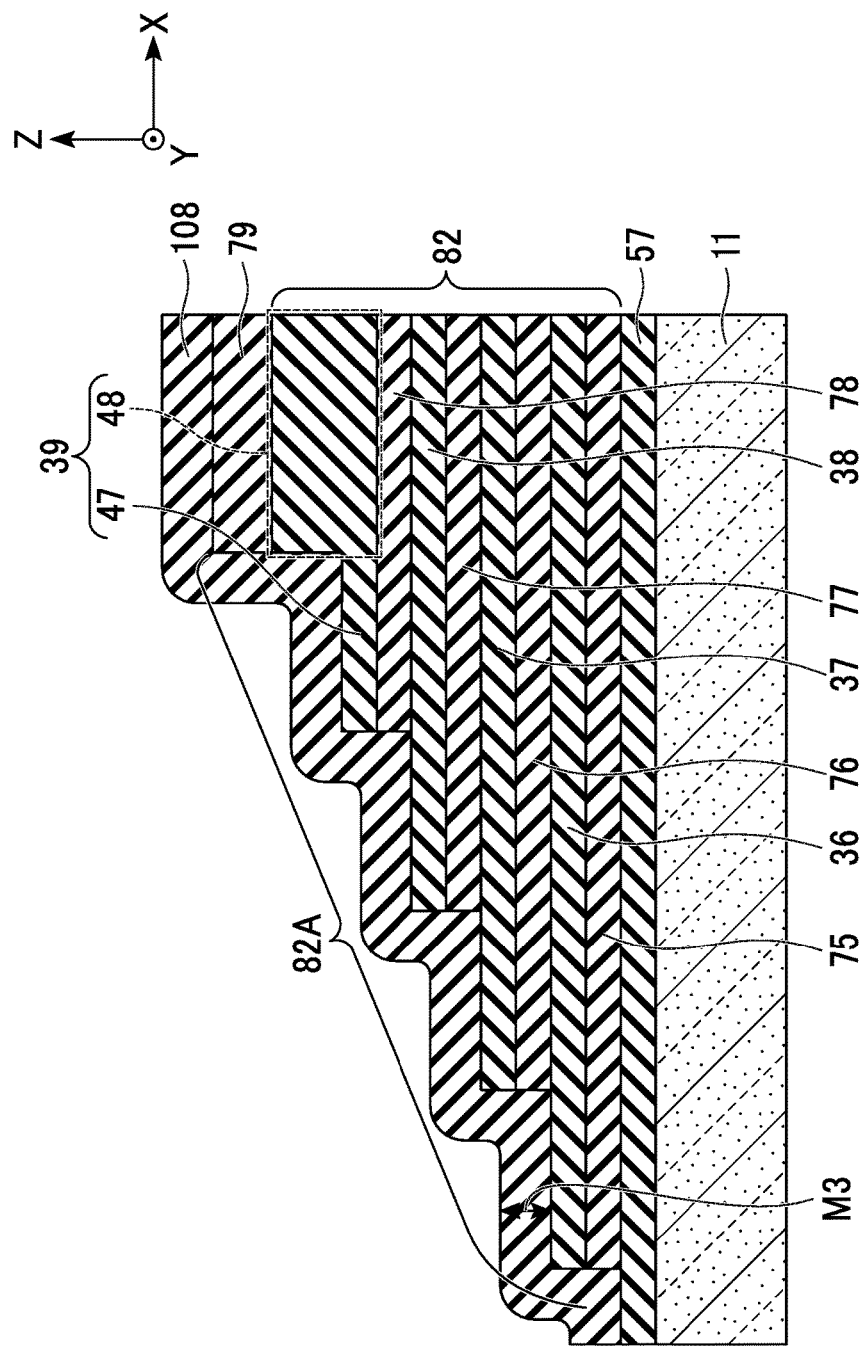
FIGS. 15 and 16 are cross-sectional views of a structure during manufacturing of the semiconductor memory device according to the second embodiment.
Figure 16:
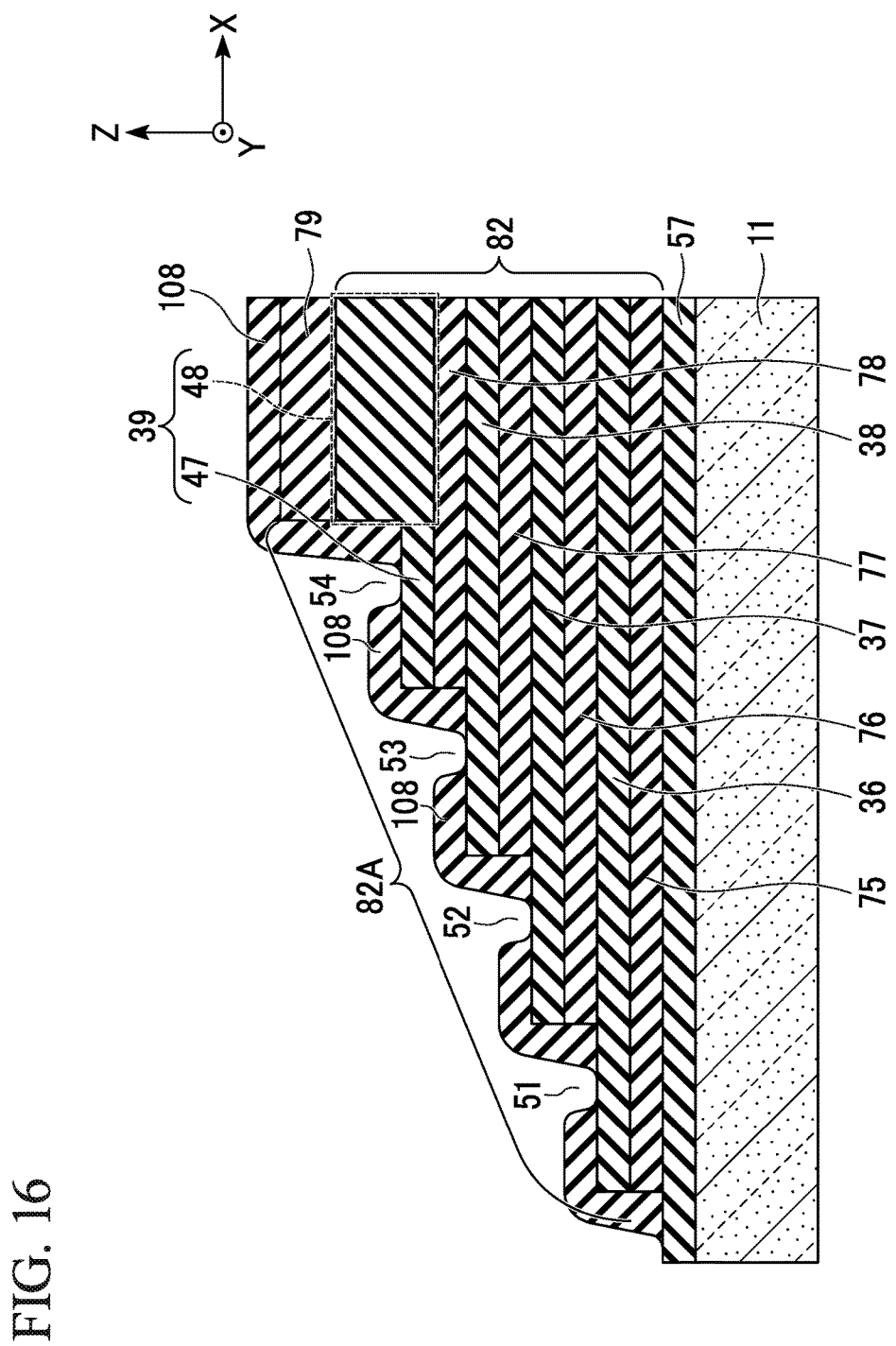

FIG. 15 and FIG. 16 are cross-sectional views of a structure to show the manufacturing process of the semiconductor memory device 106 of the second embodiment. In FIG. 15 and FIG. 16, elements that are the same as ones in the structure shown in FIG. 5 and the memory cell 106 shown in FIG. 14 are assigned the same reference symbols.

The structure shown in FIG. 5 is formed by performing processes the same as those described by FIG. 4 and FIG. 5.

In the process step shown in FIG. 15, the same type of insulating layer as the first sacrificial insulating layers 75 to 78 is used as a second sacrificial insulating layer 108 covering the staircase section 82A. The thickness M3 of the second sacrificial insulating layer 108 is made greater than the thickness M1 of the conductors 41 to 44 shown in FIG. 14.

In the process step shown in FIG. 16, by performing overall etchback of the second sacrificial insulating layer 108 shown in FIG. 15 by anisotropic dry etching in conditions of causing trenching of the steps, the grooves 51 to 55 are formed, thereby the second sacrificial insulating layer 108 being multiply separated in the direction of the extension of the staircase section 82A (second sacrificial insulating layer separation step).

Trenching is a phenomenon whereby, of a film to be etched, the film formed at a step is etched faster than the film formed on a flat surface.

Trenching can be caused, for example, by making the pressure in the chamber in which anisotropic etching is performed low or making the steps in the staircase section 82A large.

After the above, the semiconductor memory device 105 shown in FIG. 14 is manufactured by successively performing the steps shown in FIG. 8 to FIG. 13 and the contact plug forming step described in the first embodiment.

The second embodiment achieves the same effect as the first embodiment and enables a simplification of the manufacturing process of the semiconductor memory device 105.

Third Embodiment

Figure 17:
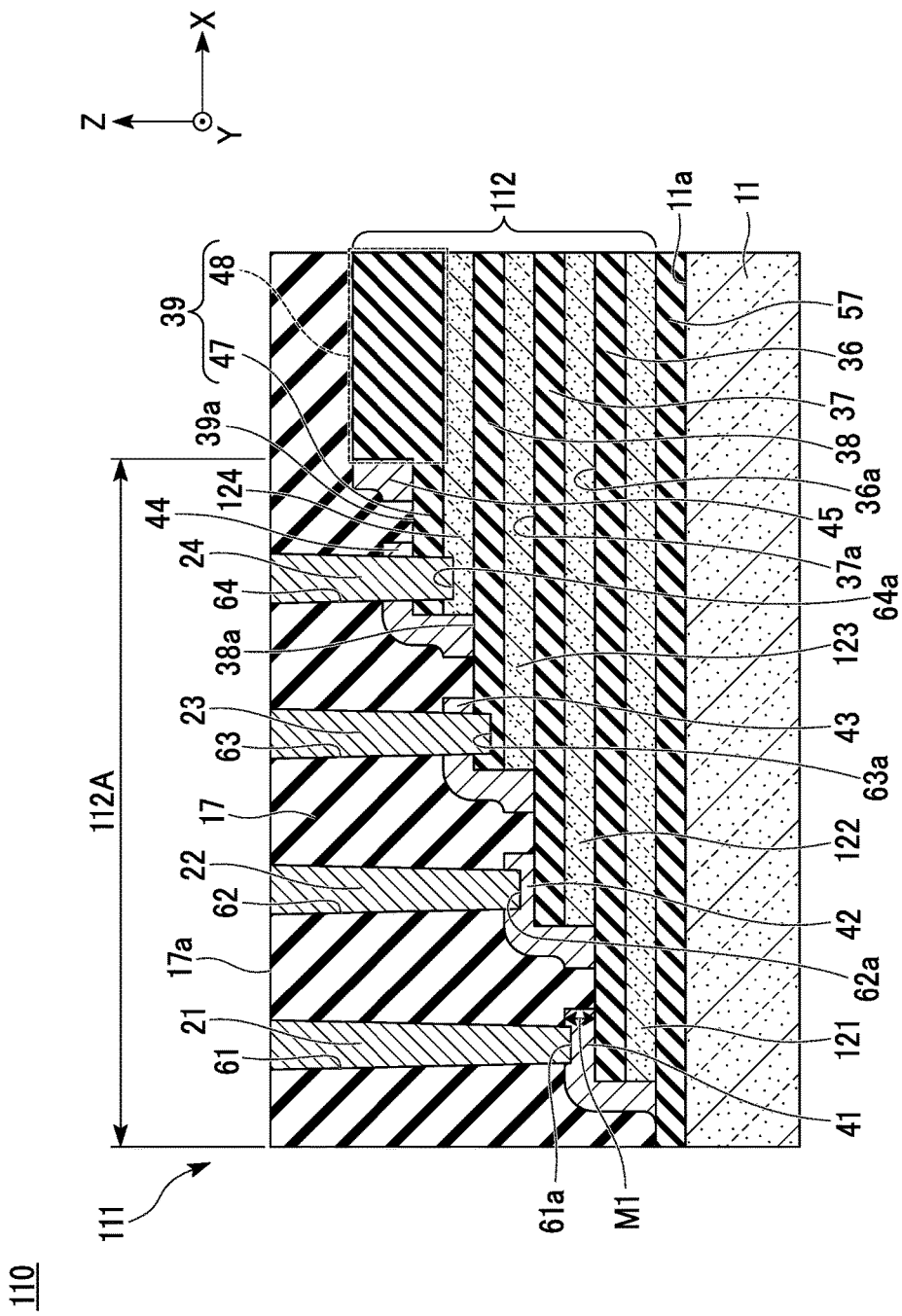
FIG. 17 is a cross-sectional view of a memory cell array of a semiconductor memory device according to a third embodiment.

FIG. 17 is a cross-sectional view of a memory cell array 111 of a semiconductor memory device 110 according to a third embodiment. In FIG. 17, elements that are the same as those of the memory cell array 2 of the semiconductor memory device 1 according to the first embodiment shown in FIG. 3 are assigned the same reference symbols.

The memory cell array 111 of the semiconductor memory device 110 of the third embodiment, with the exception of having conductive layers 121 to 124 in place of the conductive layers 31 to 34 of the memory cell array 2 of the semiconductor memory device 1 according to the first embodiment, has the same constitution as the memory cell array 2.

The memory cell array 111 has staircase structure 112 that includes a staircase section 112A.

The conductive layer 121 is formed between the insulating layer 57 and the first insulating layer 36. The end of the conductive layer 121 is joined to the conductor 41. The conductive layer 122 is formed between the first insulating layer 36 and the first insulating layer 37. The end of the conductive layer 122 is joined to the conductor 42.

The conductive layer 123 is formed between the first insulating layer 37 and the first insulating layer 38. The end of the conductive layer 123 is joined to the conductor 43. The conductive layer 124 is formed between the first insulating layer 38 and the first insulating layer 39. The end of the conductive layer 124 is joined to the conductor 44.

The conductive layers 121 to 124 include a conductive material different from that of the conductors 41 to 44. The conductors 41 to 44 are, for example, metal films (e.g., tungsten films). The conductive layers 121 to 124 are, for example, doped polysilicon or silicide layers.

A silicide layer, for example, uses a chemical compound layer of silicon and a metal (e.g., molybdenum (Mo), tungsten (W), titanium (Ti), cobalt (Co), or nickel (Ni)).

The thickness of the conductors 41 to 44 is, for example, greater than that of the conductive layers 121 to 124.

Figure 18:
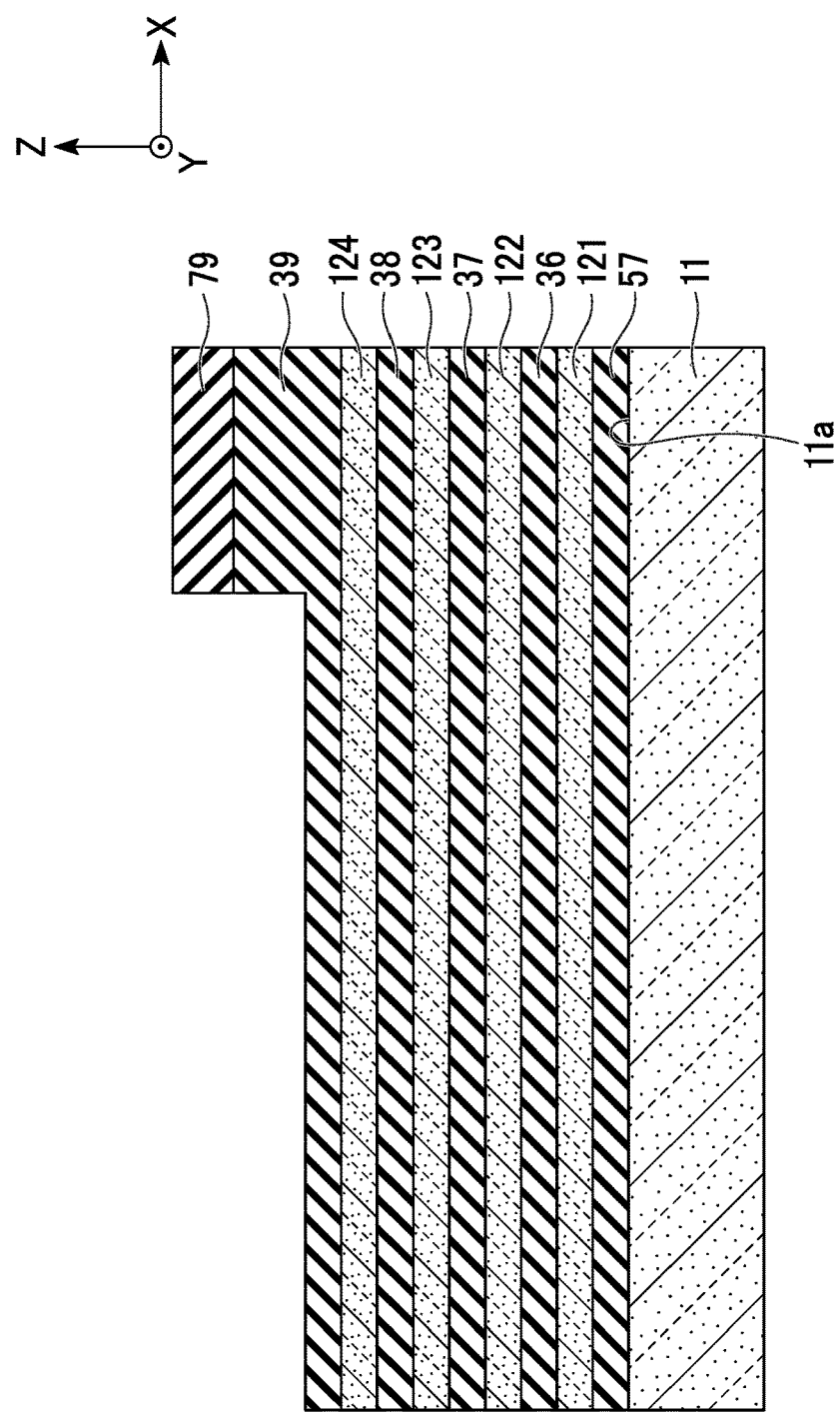
FIGS. 18 through 20 are cross-sectional view of a structure during manufacturing of the semiconductor memory device according to the third embodiment.
Figure 19:
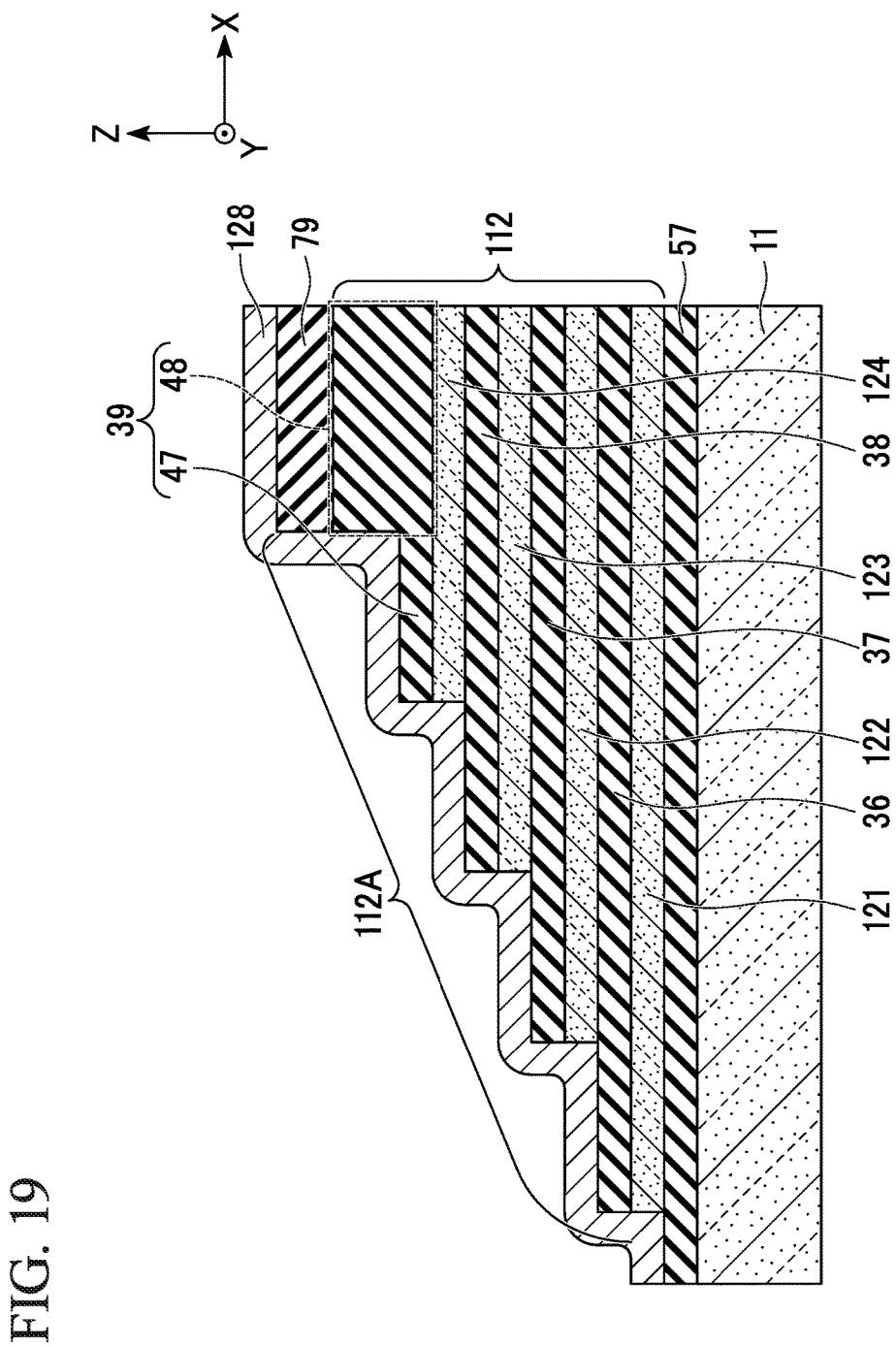
Figure 20:
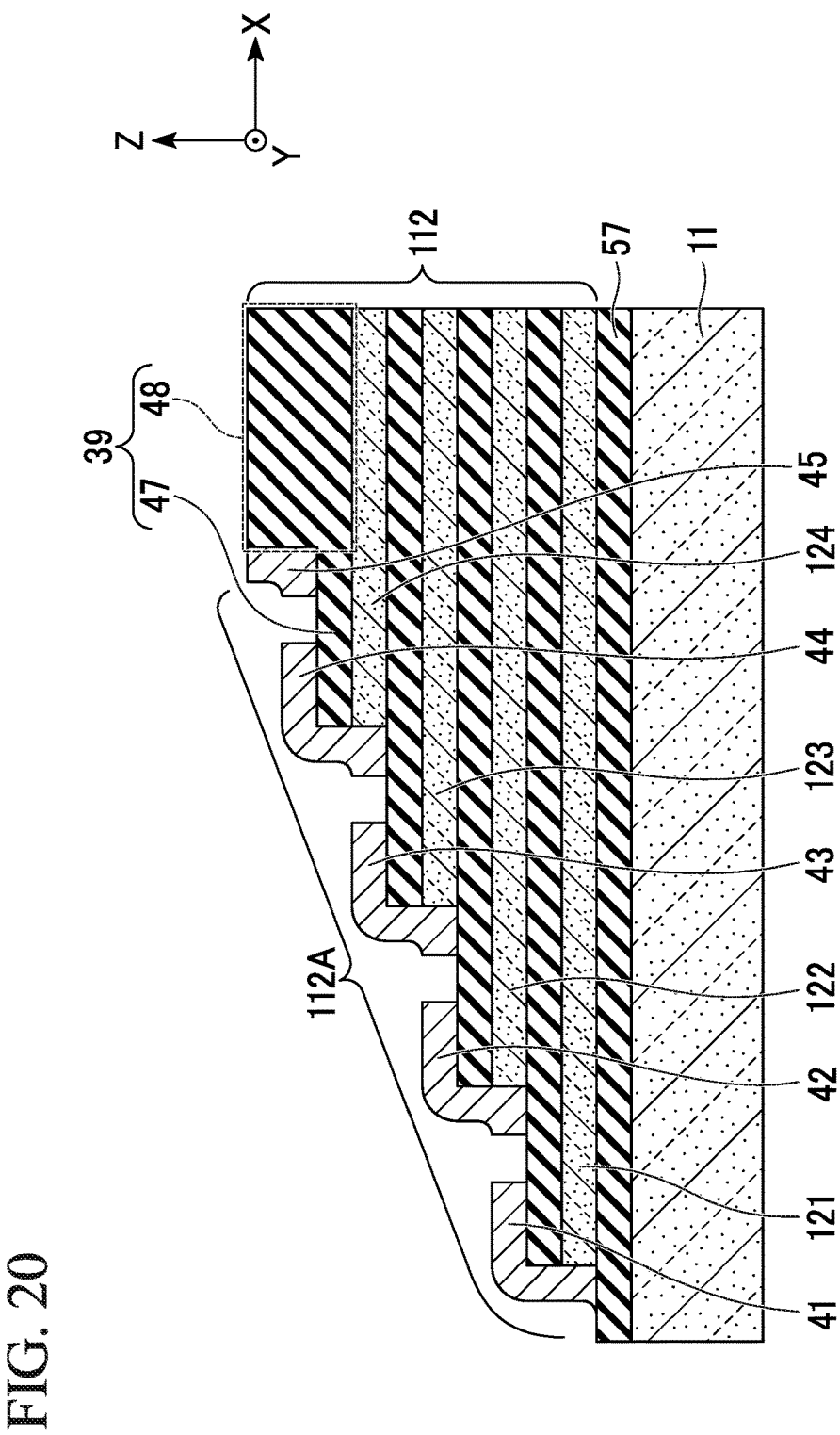

Referring to FIG. 18 to FIG. 20, the manufacturing method for the semiconductor memory device 110 according to the third embodiment will be described below. In this case, the method for manufacturing the memory cell array 111, which is the main part of the semiconductor memory device 110, will be described.

FIG. 18 to FIG. 20 are cross-sectional views showing the process for manufacturing the semiconductor memory device 110 according to the third embodiment. In FIG. 18 to FIG. 20, elements that are the same as the ones of the structure shown in FIG. 4 and the memory cell 111 of the semiconductor memory device 110 shown in FIG. 17 are assigned the same reference symbols.

In the process step shown in FIG. 18, the first insulating layer 57, the conductive layer 121, the first insulating layer 36, the conductive layer 122, the first insulating layer 37, the conductive layer 123, the first insulating layer 38, the conductive layer 124, the first insulating layer 39, and the stopper insulating film 79 are stacked on the main surface 11a of the semiconductor substrate 11 in that sequence. At this time, the first insulating layer 39 is formed with a thickness that is greater than that of the first insulating layer 39 shown in FIG. 17.

The conductive layers 121 to 124 are formed, for example, by depositing a doped silicon or silicide layer.

The stopper insulating film 79 and the first insulating layer 39 are patterned by performing the same processing as in FIG. 4.

In the processing step shown in FIG. 19, the structure shown in FIG. 18 is patterned, and the laminated structure 112 that includes the staircase section 112A at its end is formed. The conductors 41 to 44 that are joined to the conductive layers 121 to 124 are formed. At this time, the remaining conductive part 45 is also formed. The thickness of the conductors 41 to 44 is, for example, greater than that of the conductive layers 121 to 124.

Process steps the same as the process steps shown in FIG. 8 to FIG. 12 described in the first embodiment are performed and the contacts 21 to 24 shown in FIG. 17 are formed to manufacture the semiconductor memory device 110 of the third embodiment.

The third embodiment also achieves the same effect as the first embodiment.

According to the third embodiment, the conductors 41 to 44 are formed without using a replacement process. For that reason, there is no restriction imposed by the replacement process on the thickness of the conductors 41 to 44, thereby enabling expansion of the process margin.

Although in the first to the third embodiments, the staircase sections 13A, 82A, and 112A are single steps, they may be matrix arrangement of steps.

According to at least one of the above-described embodiments, of the contacts 21 to 24, even if a lower end of the contact 24 protrudes the conductor 44, the protrusion can be stopped at the conductive layer 34, thereby enabling expansion of the process margin.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present embodiment.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a substrate;
    a stack of first insulating layers and conductive layers that are alternately formed on the substrate in a memory region and a peripheral region of the semiconductor storage device, the conductive layers being electrically insulated from each other;
    a second insulating layer covering the stack of the first insulating layers and the conductive layers in the peripheral region; and
    a plurality of contact wirings formed in the peripheral region, each contact wiring extending from an upper surface of the second insulating layer towards the substrate and electrically connected to a corresponding one of the conductive layers, wherein
    in the peripheral region, each conductive layer has an extended portion that covers side and upper surfaces of an end portion of a first insulating layer that is formed immediately above said each conductive layer, and each contact wiring is in direct contact with the extended portion of the corresponding conductive layer.

2. The semiconductor storage device according to claim 1, wherein
    at least one of the contact wirings is in contact with the extended portion of the corresponding conductive layer and not in contact with the first insulating layer that is formed immediately above the corresponding conductive layer.

3. The semiconductor storage device according to claim 1, wherein
    at least one of the contact wirings penetrates the extended portion of the corresponding conductive layer to be in contact with the first insulating layer that is formed immediately above the corresponding conductive layer.

4. The semiconductor storage device according to claim 3, wherein
    said at least one of the contact wirings does not extend through the first insulating layer formed immediately above the corresponding conductive layer.

5. The semiconductor storage device according to claim 3, wherein
    said at least one of the contact wirings extends through the first insulating layer formed immediately above the corresponding conductive layer.

6. The semiconductor storage device according to claim 1, wherein
    a first part of the contact wirings is in contact with the extended portion of the corresponding conductive layer and not in contact with the first insulating layer that is formed immediately above the corresponding conductive layer,
    a second part of the contact wirings penetrates the extended portion of the corresponding conductive layer to be in contact with the first insulating layer that is formed immediately above the corresponding conductive layer but does not extend through the first insulating layer formed immediately above the corresponding conductive layer, and
    a third part of the contact wirings penetrates the extended portion of the corresponding conductive layer and the first insulating layer that is formed immediately above the corresponding conductive layer and extends through the first insulating layer formed immediately above the corresponding conductive layer.

7. The semiconductor storage device according to claim 6, wherein
    the first part of the contact wirings extends farther from the upper surface of the second insulating layer than the second part of the contact wirings, and
    the second part of the contact wirings extends farther from the upper surface of the second insulating layer than the third part of the contact wiring.

8. The semiconductor storage device according to claim 1, wherein
    a thickness of an extended portion of a conductive layer is greater than a thickness of the conductive layer.

* * * * *